United States Patent
Guha et al.

(10) Patent No.: US 11,588,052 B2
(45) Date of Patent: Feb. 21, 2023

(54) SUB-FIN ISOLATION SCHEMES FOR GATE-ALL-AROUND TRANSISTOR DEVICES

(71) Applicant: INTEL CORPORATION, Santa Clara, CA (US)

(72) Inventors: Biswajeet Guha, Hillsboro, OR (US); William Hsu, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 925 days.

(21) Appl. No.: 16/055,634

(22) Filed: Aug. 6, 2018

(65) Prior Publication Data
US 2020/0044087 A1    Feb. 6, 2020

(51) Int. Cl.
*H01L 29/78* (2006.01)
*H01L 21/8238* (2006.01)
(Continued)

(52) U.S. Cl.
CPC .. *H01L 29/7856* (2013.01); *H01L 21/823814* (2013.01); *H01L 21/823821* (2013.01);
(Continued)

(58) Field of Classification Search
CPC ............. H01L 29/7856; H01L 29/0649; H01L 29/0673; H01L 29/0847; H01L 29/42356;
(Continued)

(56) References Cited

U.S. PATENT DOCUMENTS

| 9,515,138 B1 * | 12/2016 | Doris ............... H01L 21/30604 |
| 10,170,638 B1 * | 1/2019 | Reznicek .......... H01L 29/78618 |
| 2017/0222006 A1 | 8/2017 | Suh et al. |
| 2018/0047832 A1 | 2/2018 | Tapily et al. |

(Continued)

FOREIGN PATENT DOCUMENTS

| EP | 3588575 | 1/2020 | |
| WO | WO-2017111774 A1 * | 6/2017 | ............ B82Y 10/00 |

OTHER PUBLICATIONS

European Search Report for European Patent Application No. EP19183507.3 dated Dec. 12, 2019, 8 pages.
(Continued)

*Primary Examiner* — Christine A Enad
(74) *Attorney, Agent, or Firm* — Schwabe, Williamson & Wyatt, P.C.

(57) ABSTRACT

Sub-fin isolation schemes for gate-all-around (GAA) transistor devices are provided herein. In some cases, the sub-fin isolation schemes include forming one or more dielectric layers between each of the source/drain regions and the substrate. In some such cases, the one or more dielectric layers include material native to the gate sidewall spacers, for example, or other dielectric material. In other cases, the sub-fin isolation schemes include substrate modification that results in oppositely-type doped semiconductor material under each of the source/drain regions and in the sub-fin. The oppositely-type doped semiconductor material results in the interface between that material and each of the source/drain regions being a p-n or n-p junction to block the flow of carriers through the sub-fin. The various sub-fin isolation schemes described herein enable better short channel characteristics for GAA transistors (e.g., employing one or more nanowires, nanoribbons, or nanosheets), thereby improving device performance.

20 Claims, 15 Drawing Sheets

(51) Int. Cl.
- *H01L 27/088* (2006.01)
- *H01L 29/06* (2006.01)
- *H01L 29/08* (2006.01)
- *H01L 29/423* (2006.01)
- *H01L 29/66* (2006.01)

(52) U.S. Cl.
CPC .. *H01L 21/823864* (2013.01); *H01L 27/0886* (2013.01); *H01L 29/0649* (2013.01); *H01L 29/0673* (2013.01); *H01L 29/0847* (2013.01); *H01L 29/42356* (2013.01); *H01L 29/6681* (2013.01); *H01L 29/66545* (2013.01); *H01L 2029/7858* (2013.01)

(58) Field of Classification Search
CPC ........... H01L 29/66545; H01L 29/6681; H01L 21/823814; H01L 21/823864; H01L 27/0886
See application file for complete search history.

(56) References Cited

U.S. PATENT DOCUMENTS

| | | | |
|---|---|---|---|
| 2018/0190829 A1* | 7/2018 | Song | H01L 29/66545 |
| 2018/0350932 A1* | 12/2018 | Liu | H01L 21/32133 |
| 2019/0067121 A1* | 2/2019 | Chiang | H01L 29/66439 |
| 2019/0267292 A1* | 8/2019 | Chiang | H01L 29/78696 |
| 2019/0341448 A1* | 11/2019 | Bourjot | H01L 29/0653 |
| 2020/0013900 A1* | 1/2020 | Carr | H01L 21/76864 |

OTHER PUBLICATIONS

Mertens, et al., "Gate-All-Around MOSFETs based on Vertically Stacked Horizontal Si Nanowires in a Replacement Metal Gate Process on Bulk Si Substrates", 2016 IEEE, 2016 Symposium on VLSI Technology Digest of Technical Papers, 2016, 2 pages.
Office Action for European Patent Application No. EP19183507.3 dated Sep. 29, 2021, 7 pages.

* cited by examiner

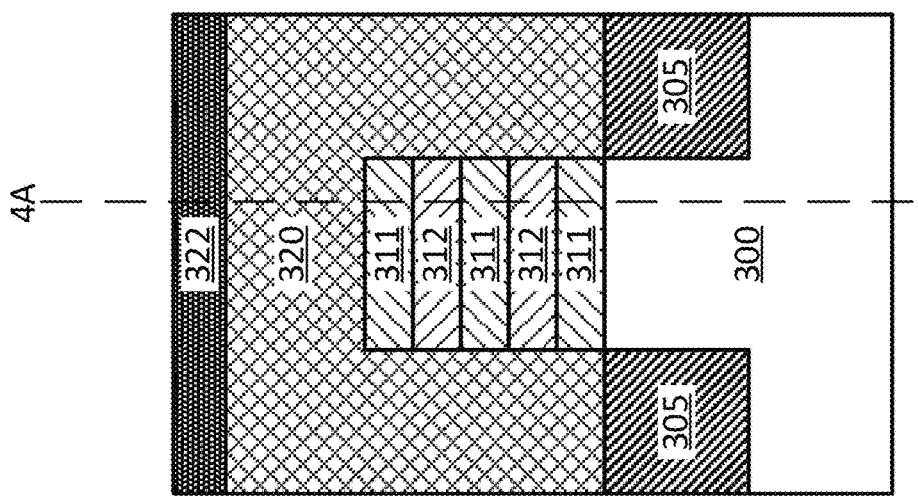
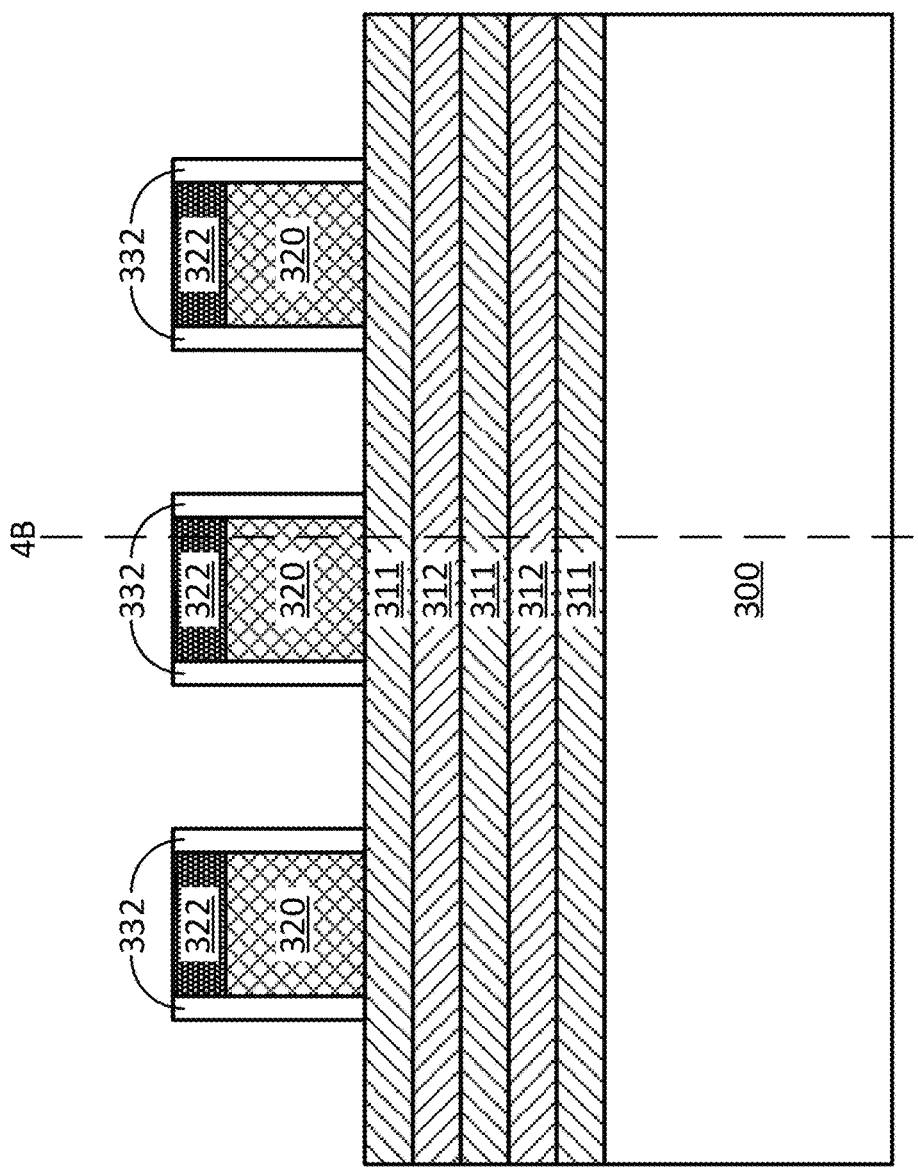
FIG. 4A
FIG. 4B

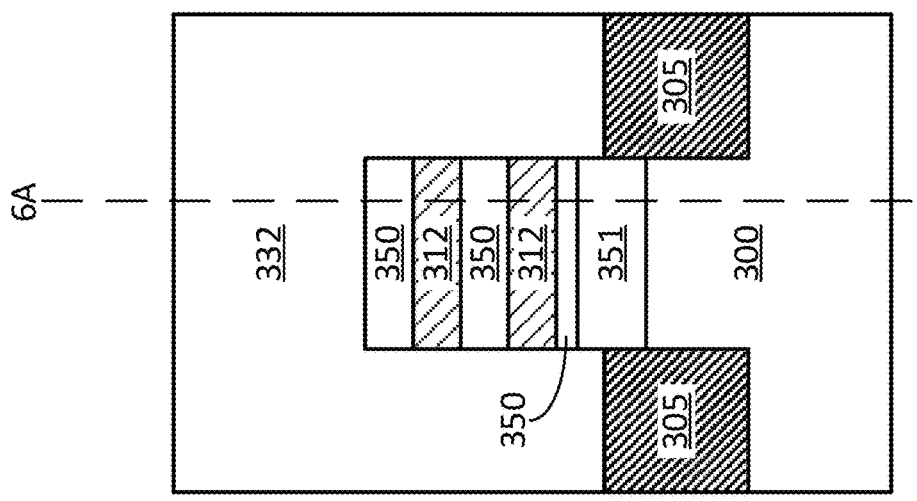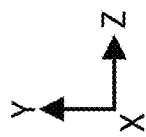
FIG. 6B
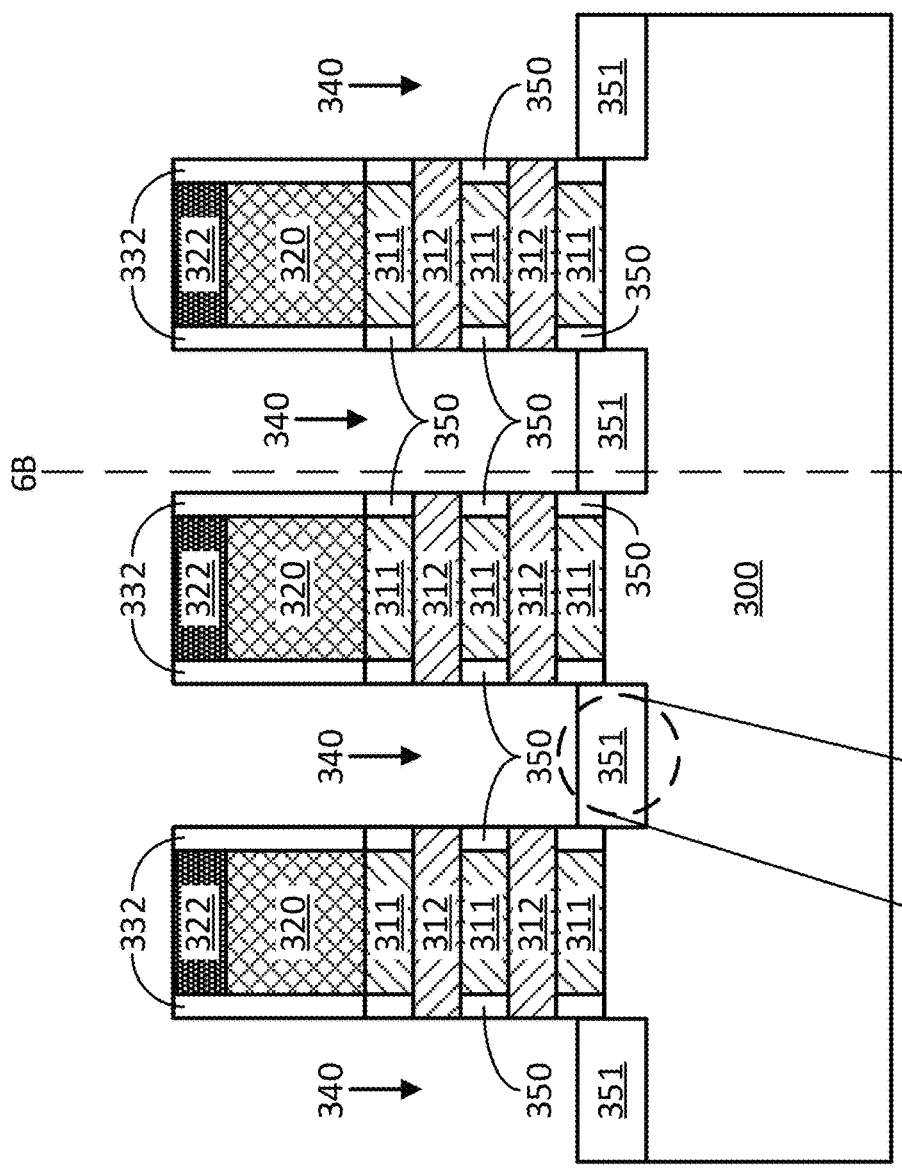
FIG. 6A
FIG. 6A'

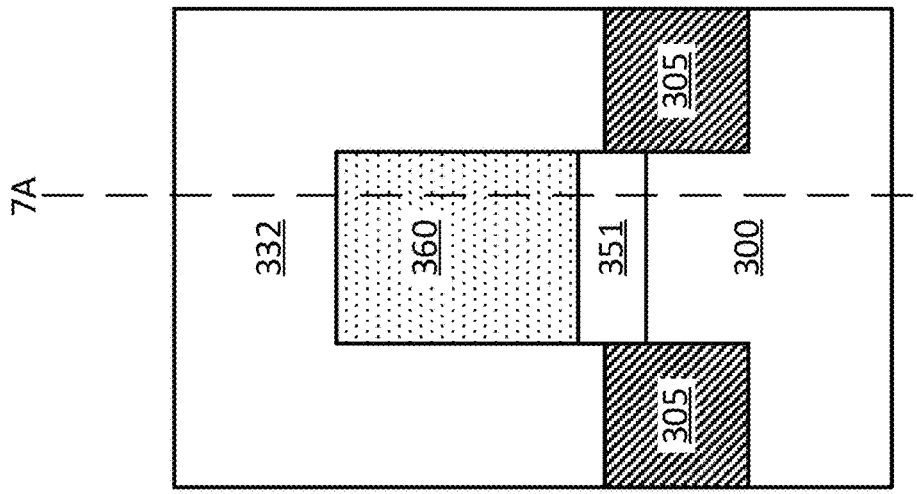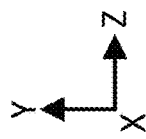
FIG. 7B
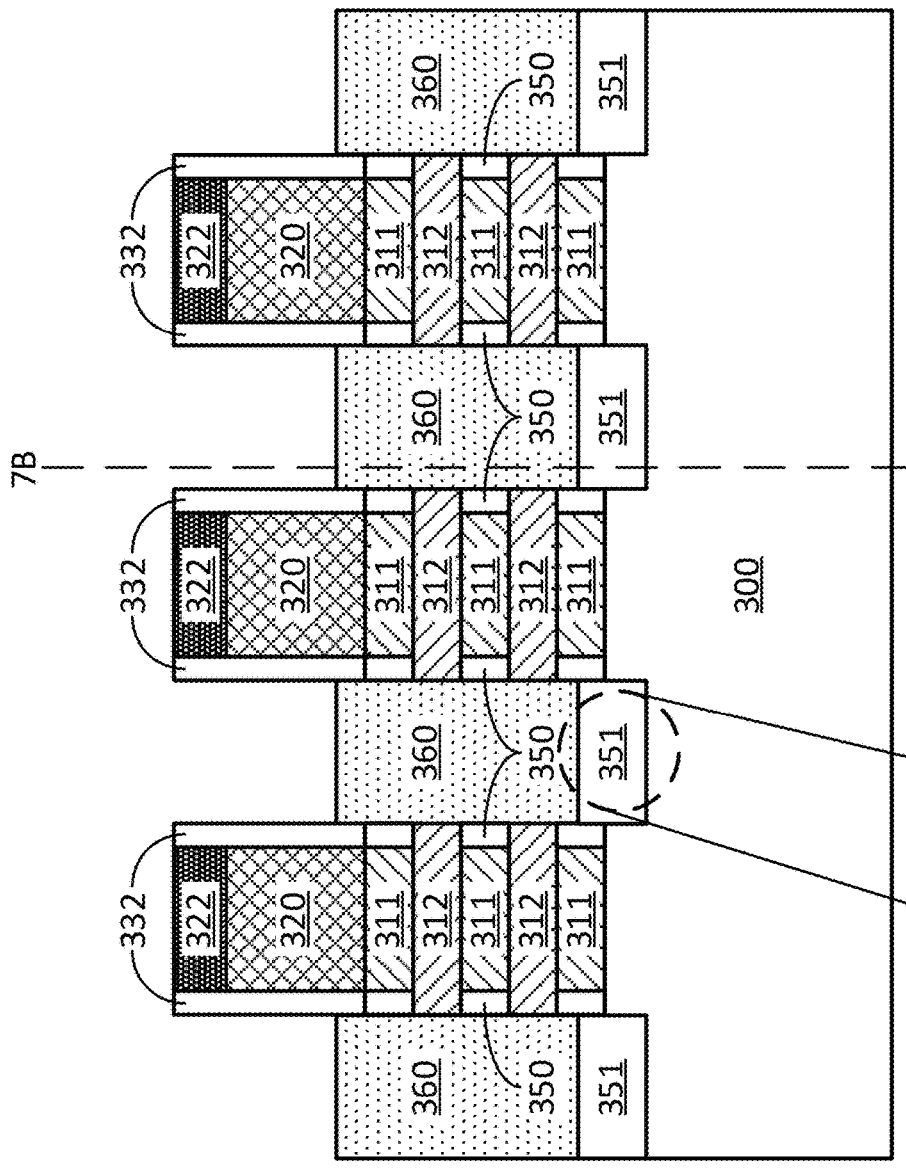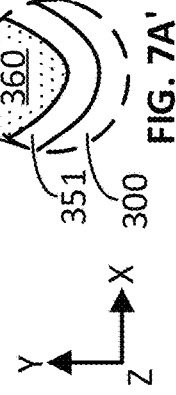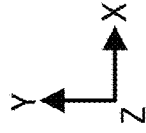
FIG. 7A
FIG. 7A'

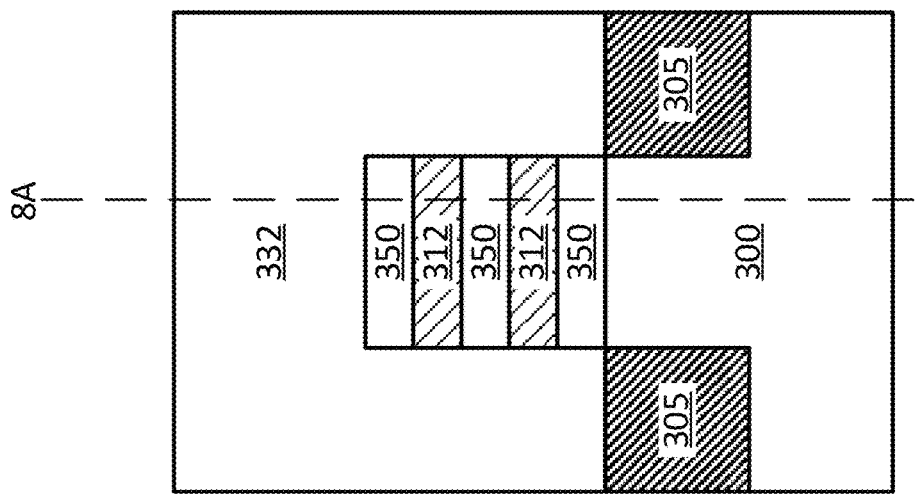
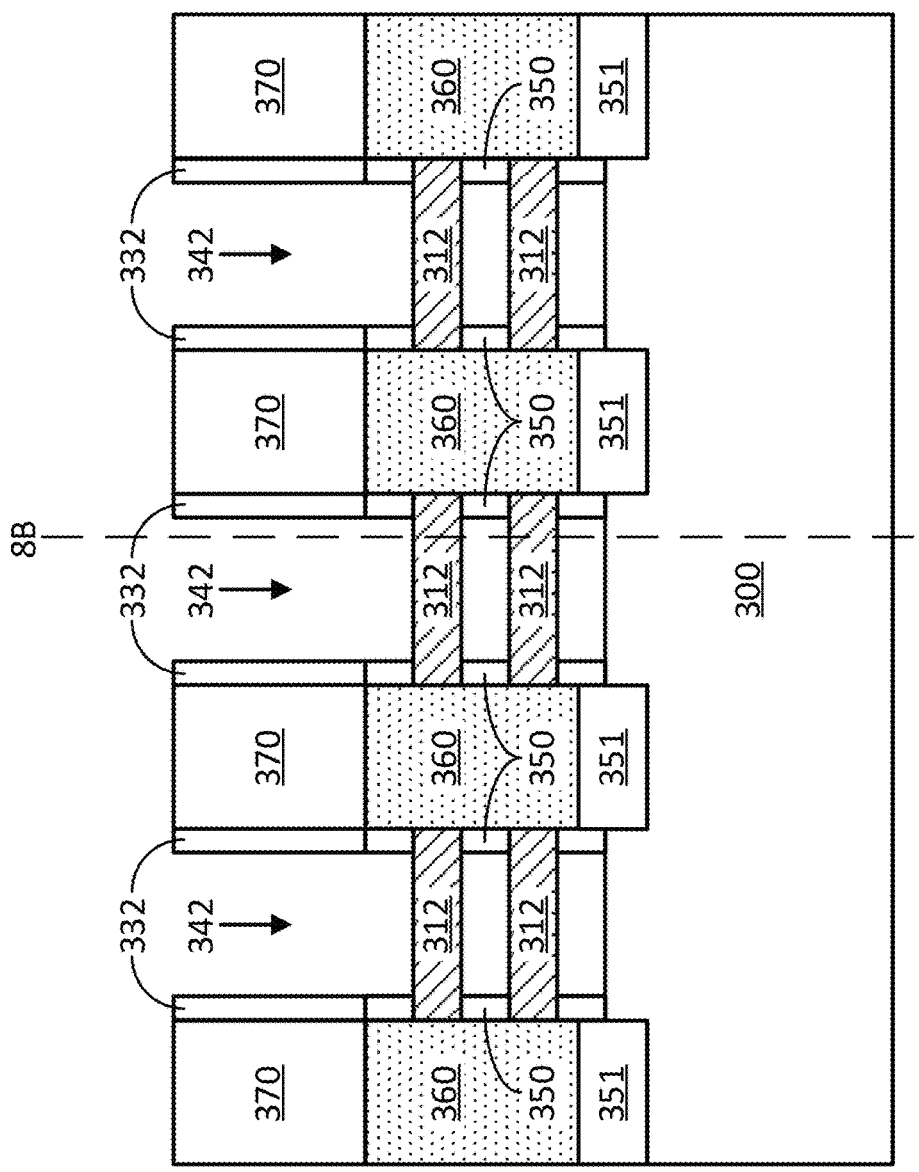
FIG. 8B
FIG. 8A

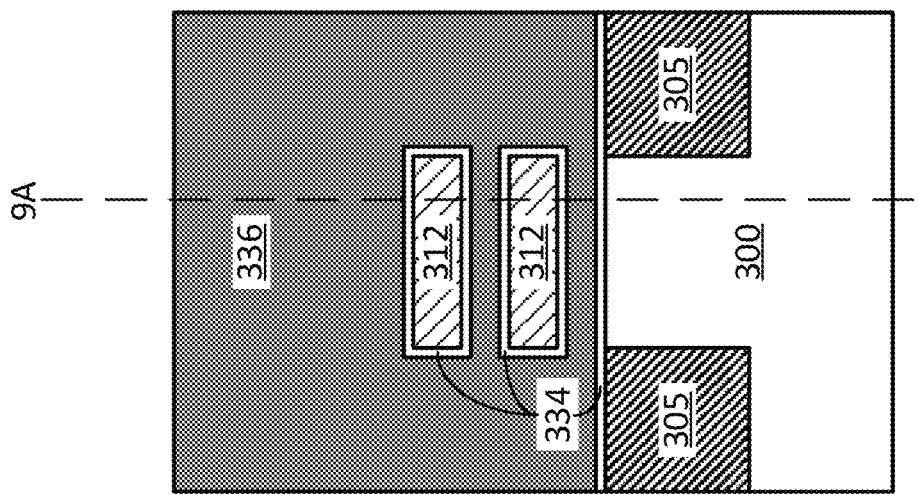
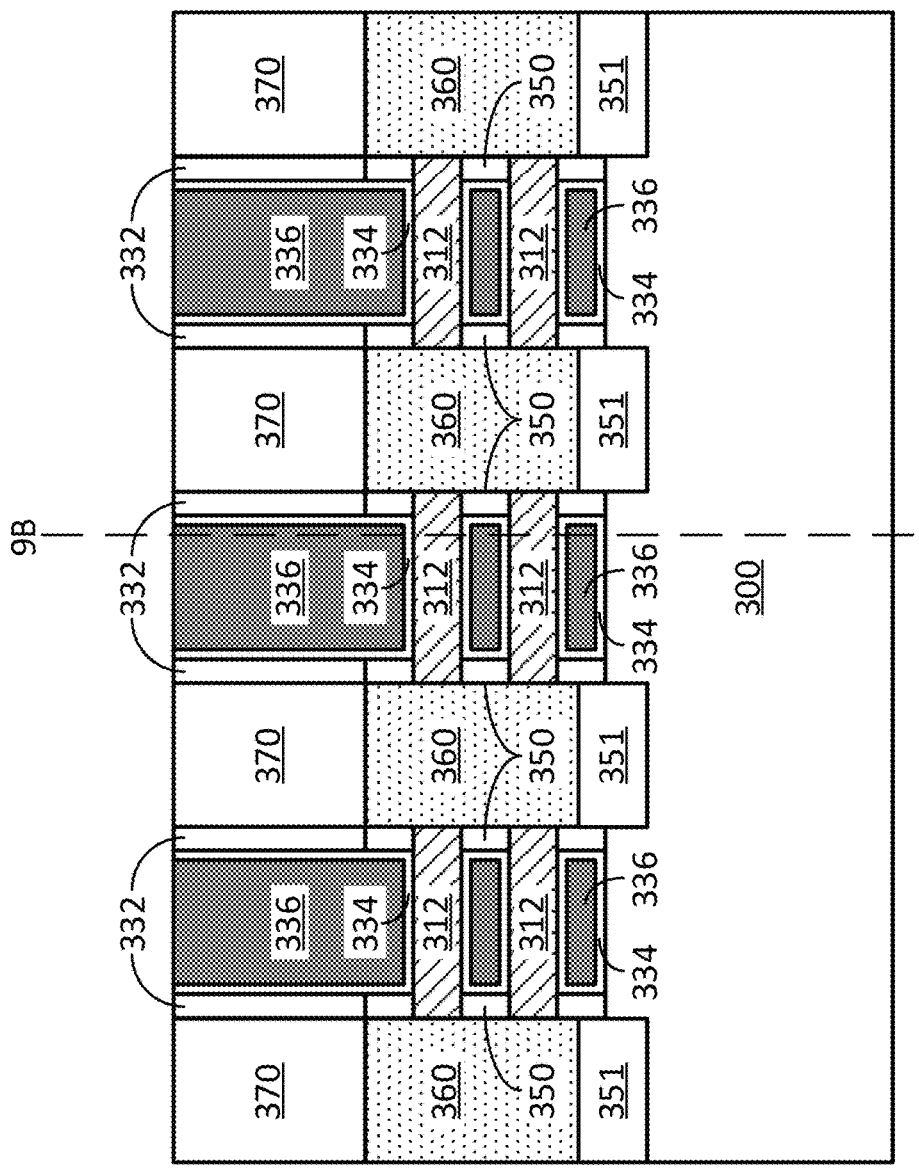
FIG. 9B
FIG. 9A

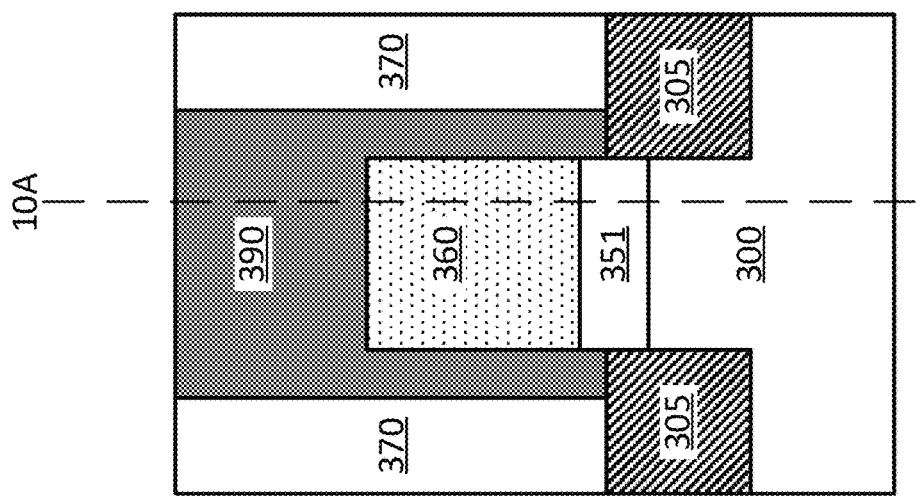
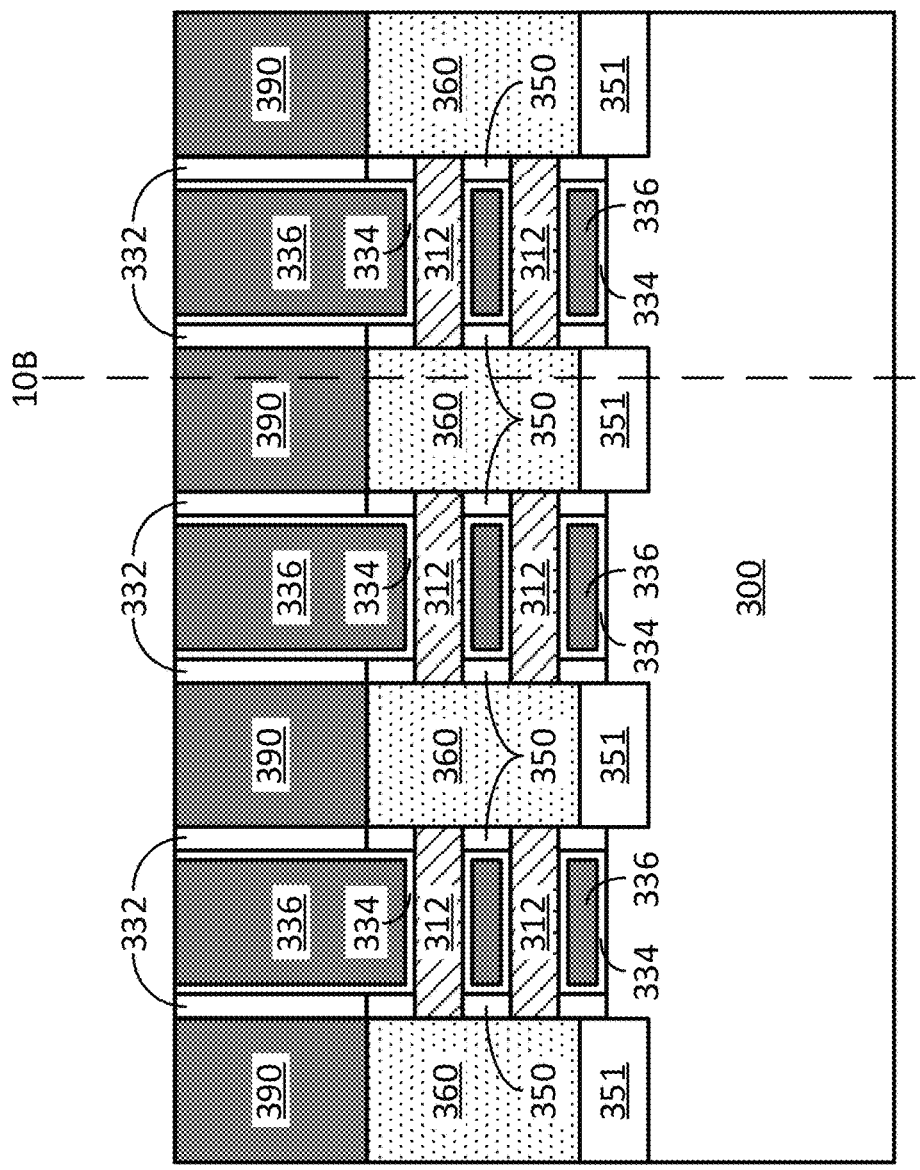
FIG. 10B
FIG. 10A

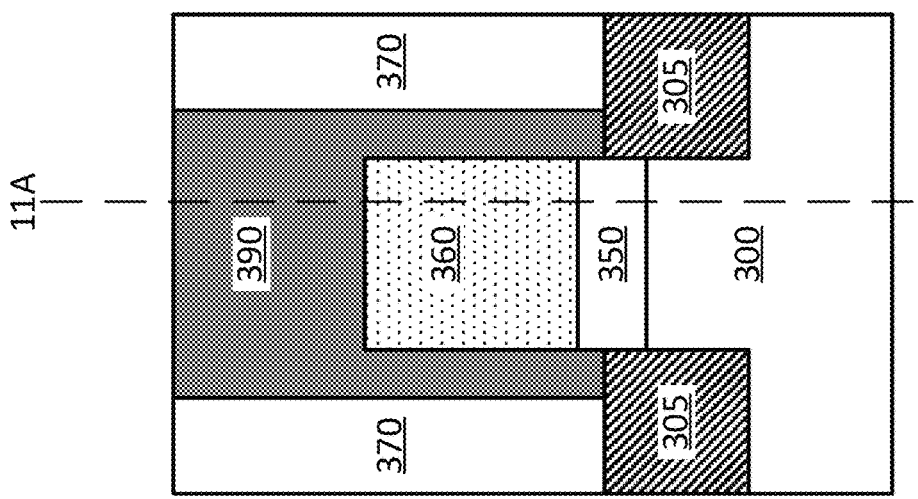
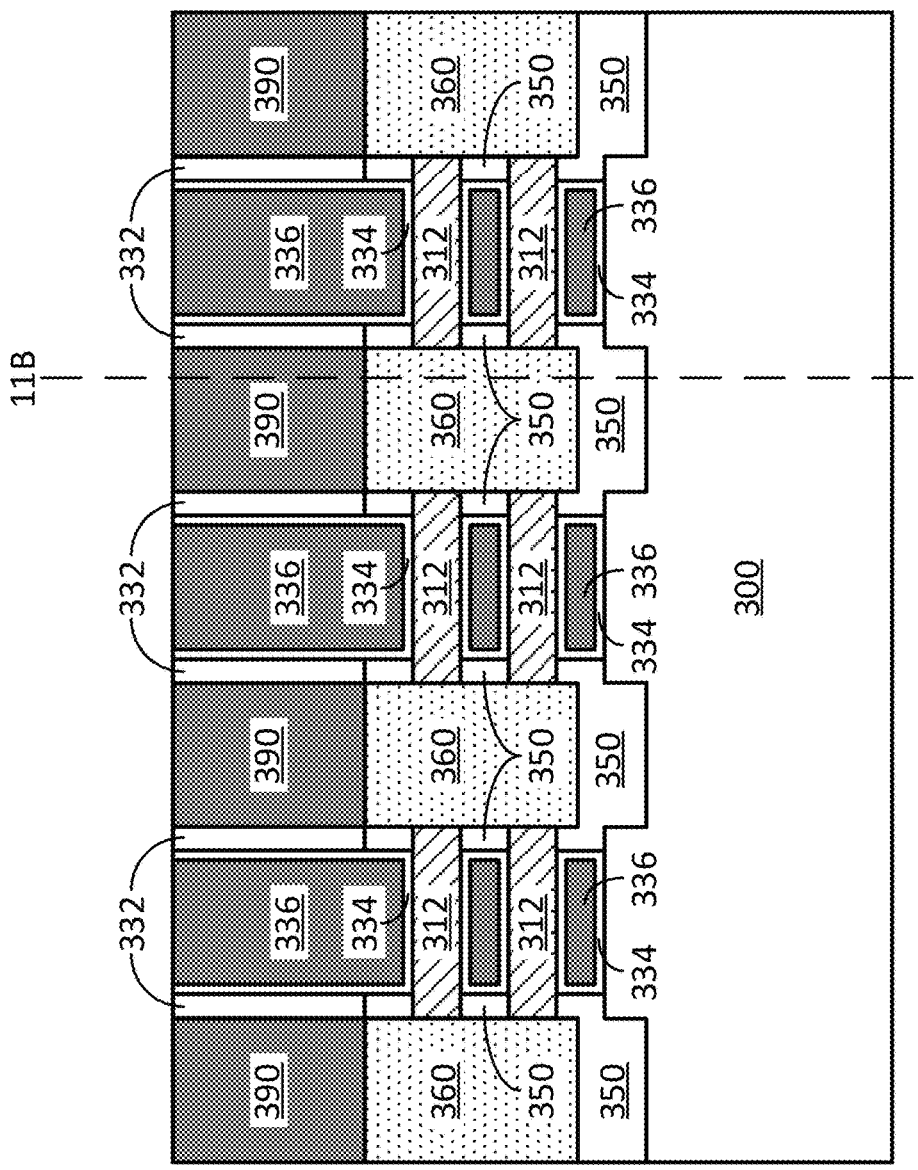
FIG. 11B
FIG. 11A

US 11,588,052 B2

SUB-FIN ISOLATION SCHEMES FOR GATE-ALL-AROUND TRANSISTOR DEVICES

BACKGROUND

Semiconductor devices are electronic components that exploit the electronic properties of semiconductor materials, such as silicon (Si), germanium (Ge), silicon germanium (SiGe) and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel or n-type device, and in instances where the charge carriers are holes, the FET is referred to as a p-channel or p-type device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A gate-all-around (GAA) transistor is configured similarly to a fin-based transistor, but instead of a finned channel region where the gate is on three portions (and thus, there are three effective gates), the gate material generally wraps around each nanowire, nanoribbon, or nanosheet included in the channel region of the GAA transistor device.

BRIEF DESCRIPTION OF THE DRAWINGS

FIG. 4A illustrates the view of FIG. 3A after dummy gate structures have been formed, in accordance with some embodiments.

FIG. 4B illustrates an example cross-sectional view along dashed line 4B shown in FIG. 4A, in accordance with some embodiments. Note that the cross-sectional view of FIG. 4A corresponds to the view taken along dashed line 4A in FIG. 4B.

FIG. 5A' is a blown-out portion of FIG. 5A illustrating a source/drain trench having a curved or faceted bottom, in accordance with some embodiments.

FIG. 6A illustrates the view of FIG. 5A after inner spacers have been formed, in accordance with some embodiments. FIG. 6A' is a blown-out portion of FIG. 6A illustrating that the dielectric layer at the bottom of the faceted or curved trench of FIG. 5A' is conformal to that trench bottom, in accordance with some embodiments.

FIG. 6B illustrates an example cross-sectional view along dashed line 6B shown in FIG. 6A, in accordance with some embodiments. Note that the cross-sectional view of FIG. 6A corresponds to the view taken along dashed line 6A in FIG. 6B.

FIG. 7A illustrates the view of FIG. 6A after source/drain material has been formed in the source/drain trenches, in accordance with some embodiments. FIG. 7A' is a blown-out portion of FIG. 7A illustrating source/drain material on the dielectric layer and in the source/drain trench of FIG. 6A', in accordance with some embodiments.

FIG. 7B illustrates an example cross-sectional view along dashed line 7B shown in FIG. 7A, in accordance with some embodiments.

FIG. 8A illustrates the view of FIG. 7A after the dummy gate structures were removed and the sacrificial layers were also removed, in accordance with some embodiments.

FIG. 8B illustrates an example cross-sectional view along dashed line 8B shown in FIG. 8A, in accordance with some embodiments. Note that the cross-sectional view of FIG. 8A corresponds to the view taken along dashed line 8A in FIG. 8B.

FIG. 9A illustrates the view of FIG. 8A after a final gate structure (including a gate dielectric and a gate electrode) is formed in each of the channel region trenches, in accordance with some embodiments.

FIG. 9B illustrates an example cross-sectional view along dashed line 9B shown in FIG. 9A, in accordance with some embodiments. Note that the cross-sectional view of FIG. 9A corresponds to the view taken along dashed line 9A in FIG. 9B.

FIG. 10A illustrates the view of FIG. 9A after source/drain contact structures have been formed, in accordance with some embodiments.

FIG. 10B illustrates an example cross-sectional view along dashed line 10B shown in FIG. 10A, in accordance with some embodiments. Note that the cross-sectional view of FIG. 10A corresponds to the view taken along dashed line 10A in FIG. 10B.

FIG. 11A illustrates the integrated circuit structure of FIG. 10A, except that inner spacer material is also between the source/drain regions and the substrate, in accordance with some embodiments.

FIG. 11B illustrates an example cross-sectional view along dashed line 11B shown in FIG. 11A, in accordance with some embodiments. Note that the cross-sectional view of FIG. 11A corresponds to the view taken along dashed line 11A in FIG. 11B.

Figure 1:
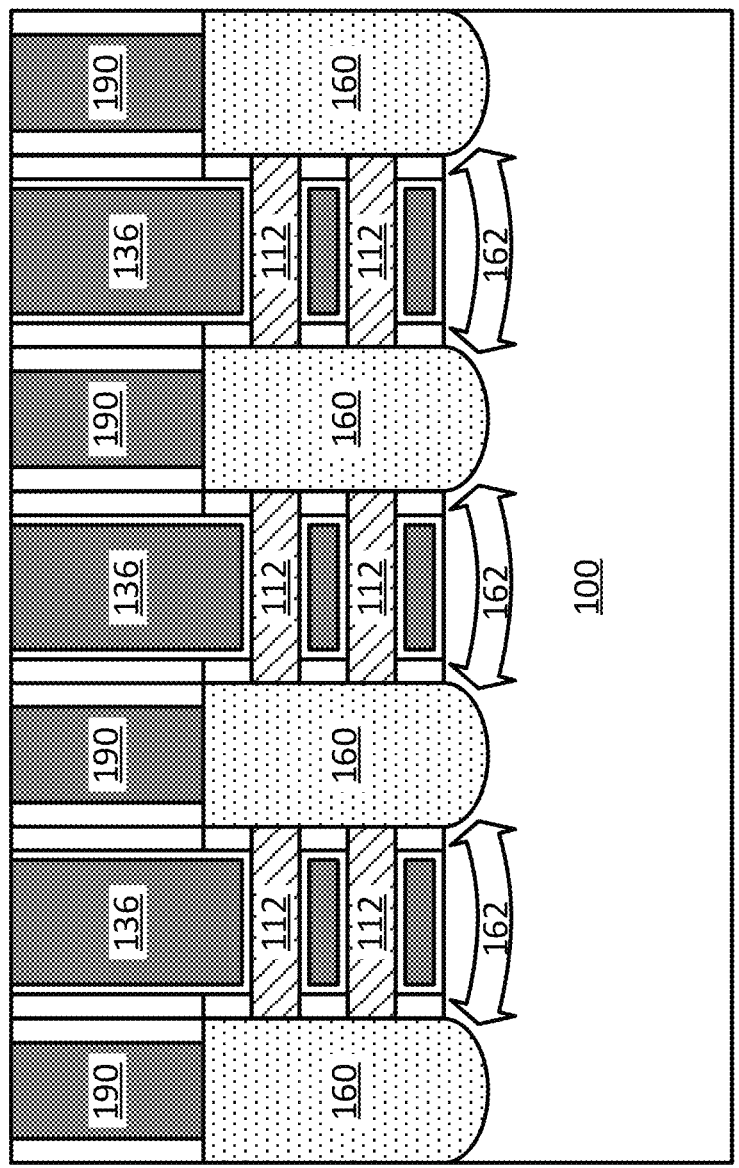
FIG. 1 illustrates a cross-sectional view of an example integrated circuit (IC) structure showing gate-all-around (GAA) transistor devices susceptible to sub-fin leakage.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

Implementation of gate-all-around (GAA) transistors that, for example, employ one or more nanowires, nanoribbons, or nanosheets face a number of non-trivial issues, particularly given that GAA transistor devices are being formed closer and closer to keep up with scaling demands. One such non-trivial issue is poor short channel properties that occurs due to conduction through the substrate. This conduction may also be referred to as uncontrolled sub-fin leakage, which is undesired leakage between the source and drain regions through the sub-fin (e.g., when the transistor is in an off-state). The sub-fin is a region below the active height of the channel region of the GAA transistor device. Sub-fin leakage results in undesirable power consumption, thereby decreasing device performance. For instance, FIG. 1 illustrates a cross-sectional view of an example integrated circuit (IC) structure showing GAA transistor devices susceptible to sub-fin leakage 162. The IC structure includes substrate 100, nanowires 112, gate structures 136, source/drain regions 160, and source/drain contacts 190. As shown, sub-fin leakage 162 is an issue when, for example, the source is receiving current and some of that current passes from the source region to the drain region through the sub-fin, which in this case is the portion of the substrate 100 below the gate structure 136 and nanowires 112. One approach to reduce or eliminate sub-fin leakage is to employ silicon on insulator (SOI) substrates in place of bulk silicon substrates. However, SOI substrates are more expensive than bulk silicon substrates. Further, additional processing may be required, such as forming the stack of channel and sacrificial material layers elsewhere and transferring the stack to the SOI. Further still, SOI substrates may not be suitable for high power applications, because they tend to heat up more than bulk silicon substrates.

Thus, and in accordance with various embodiments of the present disclosure, integrated circuits configured with sub-fin isolation schemes for gate-all-around (GAA) transistor devices are provided herein. In some embodiments, the integrated circuits include at least one dielectric layer between epitaxial source/drain material and an underlying substrate. For instance, in some such embodiments, a dielectric layer is provisioned on the substrate before the source/drain epitaxy, which prevents any epitaxial growth of the source/drain material on the substrate. In other such embodiments, the gate sidewall spacer material is formed around the released body(ies) of channel material and also below where the source/drain regions are to be formed. In such embodiments, the source/drain trench etch can be stopped before reaching the substrate, which again prevents any epitaxial growth of the source/drain material on the substrate. In some such embodiments, a larger gap may be employed between the substrate and the bottommost body of channel material to ensure the gate sidewall spacer material suitably forms on the substrate below the targeted source/drain regions. In these sub-fin isolation schemes that employ at least one dielectric layer between the epitaxial source/drain material and the substrate, the epitaxial source/drain material can be seeded or otherwise grown from the exposed sidewalls of the channel material layers (rather than the underlying dielectric material), as can be understood based on this disclosure. Note that body(ies) of channel material as referred to herein may include one or more nanowire, nanoribbons, and/or nanosheets.

In still other embodiments, rather than provisioning a dielectric layer, the sub-fin isolation is provided by selectively doping the substrate under the multilayer stack that includes channel material layers. The channel material layers remain largely or completely undoped. In some such embodiments, the selective substrate doping is achieved by doping a blanket layer or wafer prior to forming the multilayer stack (e.g., via epitaxial growth) and/or after the multilayer stack has been formed (e.g., after the stack has been shaped into one or more fins). In some embodiments, the selective substrate doping is achieved by forming a layer of doped semiconductor material on the bulk substrate instead of (or in addition to) implanting dopant directly into to the top portion of the substrate. In either such case, the dopant concentration employed may be as high as possible without damaging the crystal structure and/or causing back diffusion, such as a dopant concentration in the range of 1E18-1E20 (or 1E18-1E19) atoms per cubic centimeter (cm), for example. As can be understood based on this disclosure, the substrate doping (whether that doping is directly in the top portion of the substrate and/or is via a layer formed on the substrate) has opposite type doping relative to the final source/drain material, such that a p-n or n-p junction is formed between the source/drain material and the underlying material, thereby providing sub-fin electrical isolation. In addition, in some embodiments employing such a substrate doping scheme for sub-fin isolation, an epitaxial diffusion barrier layer may also be employed to help prevent undesired channel doping. For instance, the epitaxial diffusion barrier layer may include carbon and/or other suitable material(s) to help prevent the opposite-type dopant from migrating to the overlying channel material layers, to provide an example. In another example, the bottommost sacrificial layer of the multilayer stack of channel and sacrificial material layers may include properties to help prevent diffusion of the dopant into the channel material layers, such as including material that helps prevent such diffusion (e.g., SiGe acts as a good diffusion barrier for boron) and/or having a relatively increased thickness compared to the other layers in the multilayer stack.

The various sub-fin isolation schemes disclosed herein for GAA transistor devices help minimize or prevent undesired sub-fin leakage between the source and drain regions, thereby improving short channel properties for the device. For instance, the techniques and structures described herein enable robust functionality of GAA transistor devices, such as enabling relatively lower power and higher performance operation as compared to devices that do not employ any of the sub-fin isolation schemes variously described herein. Numerous other benefits will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items.

Note that the use of "source/drain" or "S/D" herein is simply intended to refer to just a source region, just a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including at least one gate-all-around (GAA) transistor and including one or more of the sub-fin isolation schemes as variously described herein. For instance, in some embodiments, one or more dielectric layers are between a given source/drain region (e.g., semiconductor material) and the substrate (e.g., a bulk silicon substrate), which can be detected using TEM, for example. In other embodiments, the p-n or n-p junction between a given source/drain region (e.g., semiconductor material doped one of n-type or p-type) and underlying semiconductor material (e.g., semiconductor material doped the other of n-type or p-type, and formed in and/or on the substrate), which can be detected using TEM, EDX, and/or SIMS, for example. In some embodiments, the techniques described herein can be detected based on the structures formed therefrom. In addition, in some embodiments, the techniques and structures described herein can be detected based on the benefits derived therefrom, such as the improved short channel characteristics. Numerous configurations and variations will be apparent in light of this disclosure.

Architecture and Methodology

Figure 2:
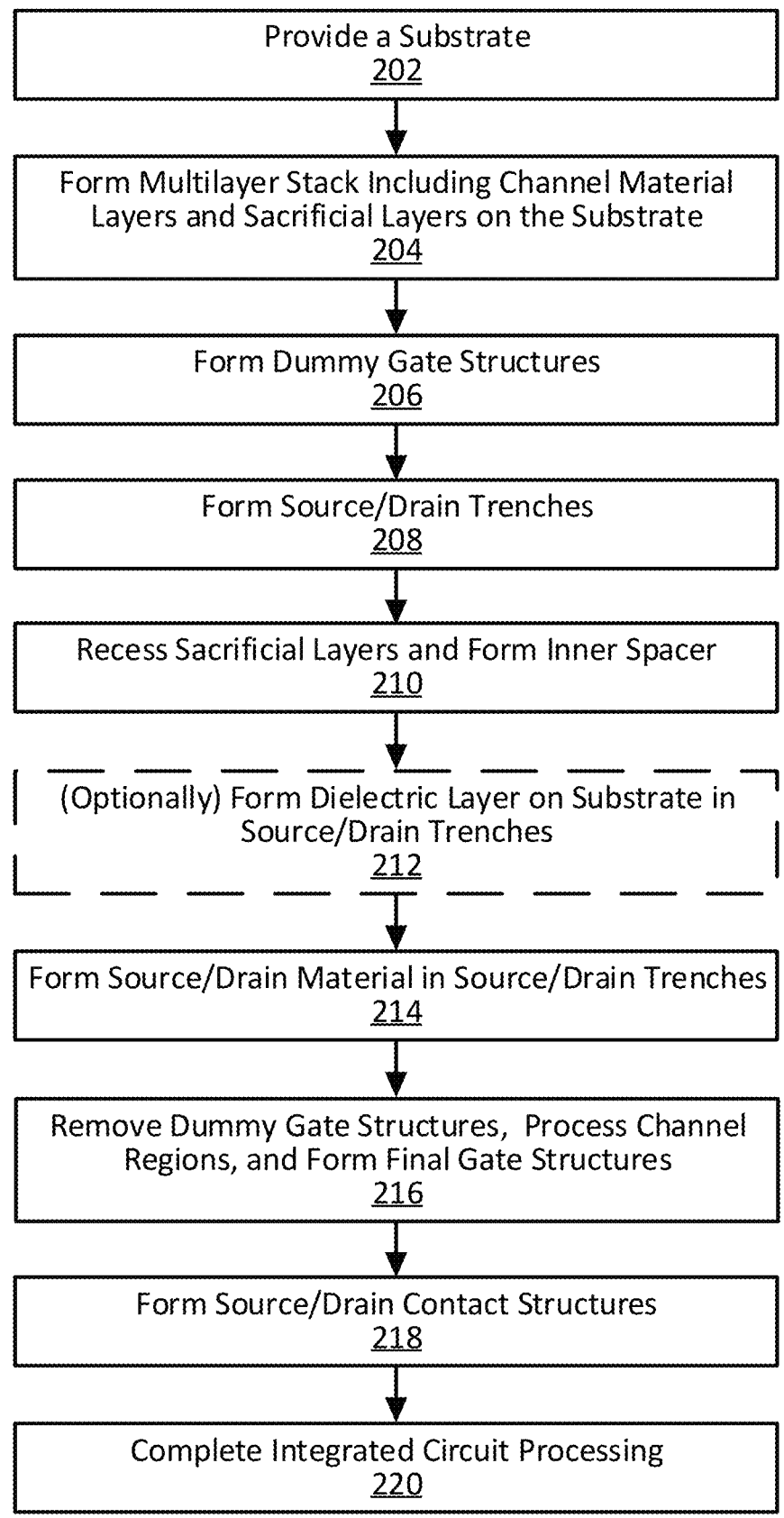
FIG. 2 illustrates example method 200 of forming an integrated circuit including various sub-fin isolation schemes for GAA transistor devices, in accordance with some embodiments.

FIG. 2 illustrates example method 200 of forming an integrated circuit (IC) including various sub-fin isolation schemes for gate-all-around (GAA) transistor devices, in accordance with some embodiments. A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device, which may include a source-channel-drain doping scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques can be used to benefit a p-channel MOSFET (PMOS) device, which may include a source-channel-drain doping scheme of p-n-p or p-i-p, in accordance with some embodiments. In yet another example, the techniques can be used to benefit a TFET device, which may include a source-channel-drain doping scheme of p-i-n or n-i-p, in accordance with some embodiments. In other words, a TFET device may appear the same as a MOSFET device, except that for TFET devices, the source and drain regions include opposite type dopant. In still another example, the techniques can be used to benefit a FFFET device, which may include a source-channel-drain doping scheme of np-i-p (or np-n-p) or pn-i-n (or pn-p-n), in accordance with some embodiments. In other words, such FFFET devices include a bilayer source region configuration where one of the sub-layers of the bilayer includes n-type dopant and the other includes p-type dopant.

Although the techniques are depicted and described herein for gate-all-around (GAA) device configurations (e.g., employing one or more nanowires or nanoribbons), the techniques could be used for other device configurations, such as finned transistor configurations or FinFET configurations, for example. Further, the techniques are used in some embodiments to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the and integrated circuit structures described herein, as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per cubic cm, or higher, for example, unless otherwise stated. In some embodiments, dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example.

Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Also note that group III may also be known as the boron group or IUPAC group 13, group IV may also be known as the carbon group or IUPAC group 14, and group V may also be known as the nitrogen group or IUPAC group 15, for example. Further note that semiconductor material described herein has a monocrystalline or single-crystal structure (also referred to as a crystalline structure) unless otherwise explicitly stated (e.g., unless referred to as having a polycrystalline or amorphous structure).

Figures 3A, 3B:
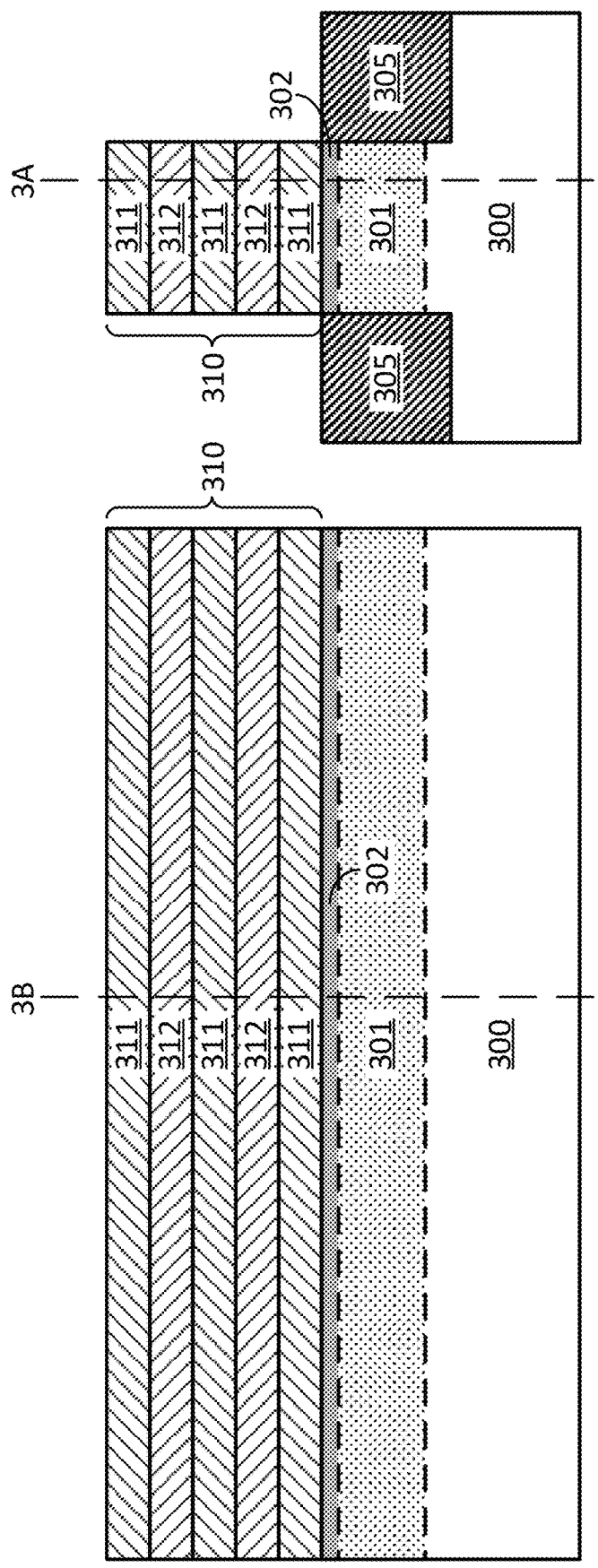
FIG. 3A illustrates an example cross-sectional view of an integrated circuit structure including a multilayer stack on a substrate, in accordance with some embodiments. Note that the cross-sectional view of FIG. 3A is taken along what will be the channel region and perpendicular to what will become the gate lines. Such a view may also be considered a gate cut view.
FIG. 3B illustrates an example cross-sectional view along dashed line 3B shown in FIG. 3A, in accordance with some embodiments. Note that the cross-sectional view of FIG. 3A corresponds to the view taken along dashed line 3A in FIG. 3B.

Method 200 of FIG. 2 includes providing 202 a substrate, such as substrate 300 shown in FIG. 3A, in accordance with some embodiments. Substrate 300, in some embodiments, is: a bulk substrate including group IV semiconductor material (such as Si, Ge, or SiGe), group III-V semiconductor material, and/or any other suitable material as can be understood based on this disclosure; an X on insulator (XOI) structure where X is one of the aforementioned semiconductor materials and the insulator material is an oxide material or dielectric material, such that the XOI structure includes the electrically insulating material layer between two semiconductor layers (e.g., a silicon-on-insulator (SOI) structure); or some other suitable multilayer structure where the top layer includes semiconductor material from which the materials of multilayer stack 310 can be formed. In some embodiments, the substrate is an insulator or dielectric substrate, such as a glass substrate. In some such embodiments, the layers for multilayer stack 310 can be transferred to that insulator or dielectric substrate to achieve a desired quality (e.g., monocrystalline quality). In some embodiments, substrate 300 is a bulk silicon substrate (that either does or does not include dopant), which may be utilized based on the relatively low cost and availability of such bulk silicon substrates.

In some embodiments, substrate 300 includes a surface crystalline orientation described by a Miller index of (100), (110), or (111), or its equivalents. Although substrate 300 is shown in the figures as having a thickness (dimension in the Y-axis direction) similar to other layers for ease of illustration, in some instances, substrate 300 may be relatively much thicker than the other layers, such as having a thickness in the range of 1 to 950 microns (or in the sub-range of 20 to 800 microns), for example, or any other suitable thickness value or range as can be understood based on this disclosure. In some embodiments, substrate 300 includes a multilayer structure including two or more distinct layers (that may or may not be compositionally different). In some embodiments, substrate 300 includes grading (e.g., increasing and/or decreasing) of one or more material concentrations throughout at least a portion of the substrate 300. In some embodiments, substrate 300 is used for one or more other IC devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

Figure 14B:
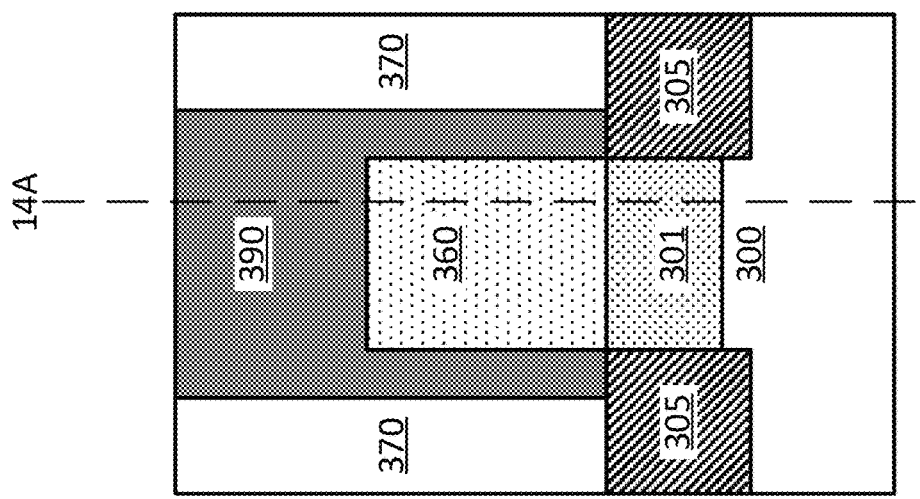
FIG. 14B illustrates an example cross-sectional view along dashed line 14B shown in FIG. 14A, in accordance with some embodiments. Note that the cross-sectional view of FIG. 14A corresponds to the view taken along dashed line 14A in FIG. 14B.
Figure 14A:
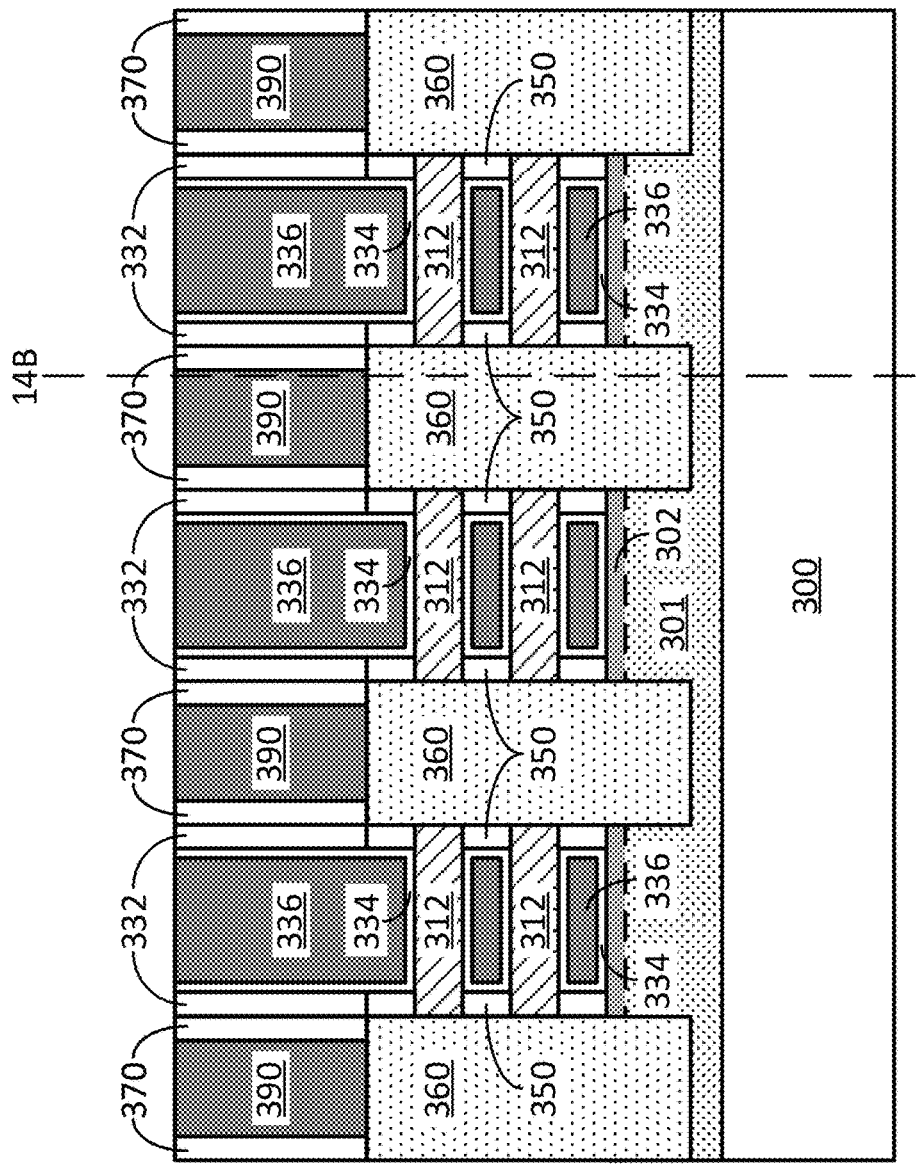
FIG. 14A illustrates the integrated circuit structure of FIG. 10A, except that substrate modification is employed for the sub-fin isolation scheme, such that there is oppositely-type doped semiconductor material below the source/drain regions, in accordance with some embodiments.

In some embodiments, optional substrate modifications occur to for sub-fin isolation purposes. For instance, in some such embodiments, a top portion of the substrate 300 is doped and/or a doped semiconductor layer is formed on the top surface of the substrate, where the dopant included in and/or on the top of the substrate 300 is opposite in type relative to the eventual final source/drain material 360. For example, if the eventual final source/drain material 360 includes p-type dopant, the substrate modification would include forming n-type doped semiconductor material, or vice versa, where the substrate modification would include forming p-type doped semiconductor material if the eventual source/drain is to be n-type doped. The processing can include doping the top surface of substrate 300 and/or forming at least one layer of doped semiconductor material on substrate 300 prior to forming multilayer stack 310, thereby forming optional doped semiconductor material 301 as shown in dashed lines in FIGS. 3A and 3B (as it is optional and may only be used for some embodiments). In addition, for some such embodiments employing substrate modification to form doped semiconductor material 301 (that is oppositely-type doped relative to the final source/drain material 360), an epitaxial diffusion barrier layer 302 may also be employed to help prevent undesired dopant from feature 301 from migrating to one or more of the channel material layers 312 in multilayer stack 310. Such an epitaxial diffusion barrier layer 302, where employed, can include carbon and/or any other suitable material(s) to help prevent the dopant from substrate modification feature 301 from diffusing into multilayer stack 310, and more specifically, into channel material layers 312. Although neither feature 301 nor epitaxial diffusion barrier layer 302 are included in subsequent IC structures formed during the implementation of method 200, an embodiment employing such features is shown in FIGS. 14A and 14B, and described herein.

Method 200 of FIG. 2 continues with forming 204 a multilayer stack on a substrate, the multilayer stack including one or more channel material layers and one or more sacrificial layers, in accordance with some embodiments.

For instance, FIG. 3A illustrates an example cross-sectional view of an integrated circuit structure including a multilayer stack 310 on substrate 300, in accordance with some embodiments. Note that the cross-sectional view of FIG. 3A is taken along what will be the channel region and perpendicular to what will become the gate lines. Such a view may also be considered a gate cut view. As can be understood based on this disclosure, the multilayer stack 310, which includes sacrificial layers 311 and channel material layers 312 in the structure of FIG. 3A, is to be used to form one or more GAA transistor devices, where the one or more channel material layers 312 are to be released from the one or more sacrificial layers 311 via selective etch processing to enable forming the gate structure of each device around the released channel material layers 312. Each of those channel material layers 312 may be referred to herein as a body, and each channel material layer or body 312 may be considered a nanowire, nanoribbon, or nanosheet, as can also be understood based on this disclosure.

As shown in FIG. 3B, the multilayer stack 310 including layers 311 and 312 has a fin shape. In more detail, FIG. 3B illustrates an example cross-sectional view along dashed line 3B shown in FIG. 3A, in accordance with some embodiments. Note that the cross-sectional view of FIG. 3A corresponds to the view taken along dashed line 3A in FIG. 3B. In some embodiments, layers 311 and 312 in the fin-shaped multilayer stack 310 can be formed using any suitable techniques as can be understood based on this disclosure. For instance, in some embodiments, the layers 311 and 312 are blanket deposited on substrate 300, patterned into fins, and then shallow trench isolation (STI) processing can be performed to form the isolation or STI regions 305, such as is shown in FIG. 3B. In other embodiments, a replacement fin processing scheme is employed, where the top portion of substrate 300 is formed into fins, STI material is formed in the trenches between the fins, the fins are recessed to form trenches between STI regions, layers 311 and 312 are deposited in the STI region trenches, and then the STI material is recessed to expose the fin-shaped multilayer stack, such as is shown in FIG. 3B. Thus, various different processes can be used to form the structure of FIGS. 3A and 3B. Although there is only one fin-shaped multilayer stack 310 shown in FIG. 3B, multiple different multilayer stacks and lines may be processed simultaneously to form hundreds, thousands, millions, or even billions of devices on an individual integrated circuit substrate, as can be understood based on this disclosure.

Multilayer stack 310, in some embodiments, includes one or more sacrificial layers 311 and one or more channel material layers 312. As shown in FIGS. 3A and 3B, the layers 311 and 312 in multilayer stack 310 alternate, where the first and last layer in the multilayer stack 310 is a sacrificial layer 311. Specifically, the multilayer stack 310 in FIGS. 3A and 3B includes three sacrificial layers 311 and two channel material layers 312, as shown. However, in other embodiments, any number of sacrificial layers 311 and channel material layers 312 may be employed, such as 1-10 or more of each. In addition, in some embodiments, the same number of sacrificial layers 311 and channel material layers 312 are included in the multilayer stack 310.

Sacrificial layers 311 and channel material layers 312, in some embodiments, include semiconductor material. In some embodiments, the layers 311 and 312 include group IV and/or group III-V semiconductor material. Thus, in some embodiments, layers 311 and 312 include one or more of germanium, silicon, tin, indium, gallium, aluminum, arsenic, phosphorous, antimony, bismuth, or nitrogen. In some embodiments, the semiconductor material included in one or both of layers 311 and/or 312 also includes dopant (n-type and/or p-type dopant), while in other embodiments, the semiconductor material is undoped/intrinsic. In some embodiments, the semiconductor material included in sacrificial layer 311 can be selectively removed relative to the semiconductor material included in channel material layers 312 via selective etch processing. Such selective etch processing allows the sacrificial layers 311 to be removed during the replacement gate processing to release the channel material layers 312.

Thus, in some embodiments, sacrificial layer 311 and channel material layers include compositionally different material, which provides the etch selectivity described herein between the two materials. Materials that are "compositionally different" or "compositionally distinct" as used herein refers to two materials that have different chemical compositions. This compositional difference may be, for instance, by virtue of an element that is in one material but not the other (e.g., silicon germanium is compositionally different from silicon), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., boron versus arsenic/phosphorous) or the same dopants but at differing concentrations. In still other embodiments, compositionally different materials may further refer to two materials that have different crystallographic orientations. For instance, (110) Si is compositionally distinct or different from (100) Si.

In some embodiments, both of layers 311 and layers 312 include group IV semiconductor material. For instance, in some such embodiments, one of layers 311 or layers 312 includes Si, and the other of layers 311 or layers 312 includes SiGe or Ge (e.g., sacrificial layers 311 include Si and channel material layers include Ge). Further, in some embodiments, one of layers 311 or layers 312 includes SiGe, and the other of layers 311 or layers 312 includes Si, Ge, or SiGe. Further still, in some embodiments, one of layers 311 or layers 312 includes Ge, and the other of layers 311 or layers 312 includes Si or SiGe. Regardless, in any such embodiments where both of layers 311 and 312 include group IV semiconductor material, the Ge concentration included in layers 311 and 312 may be relatively different by at least 20, 25, 30, 35, or 40 atomic percent to ensure etch selectivity can be achieved, for example. In some embodiments, both of layers 311 and 312 include group III-V semiconductor material. For instance, in some such embodiments, one of layers 311 or layers 312 includes GaAs, and the other of layers 311 or layers 312 includes InGaAs or InP. Further in some embodiments, one of layers 311 or layers 312 includes InGaAs, and the other of layers 311 or layers 312 includes GaAs, InP, or InGaAs (e.g., with a different In:Ga ratio). Further still, in some embodiments, one of layers 311 or layers 312 includes InP, and the other of layers 311 or 312 includes GaAs or InGaAs. In some embodiments, one of layers 311 or layers 312 includes group IV semiconductor material, and the other of layers 311 or layers 312 includes group III-V semiconductor material. For instance, in some such embodiments, one of layers 311 or layers 312 includes SiGe or Ge, and the other of layers 311 or layers 312 includes GaAs, InGaAs, or InP, for example.

In some embodiments, multilayer stack 310 has a thickness (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or within any other suitable range or having any other suitable value as can be understood based on this disclosure. In some embodiments, multilayer stack 310 has a thickness of at least 5, 10, 15, 20, 25, 50, 80, 100, 120, or 150 nm, and/or at most 200, 150, 120, 100, 80, 50, or 25 nm, for example. In some embodiments, sacrificial layers 311 and channel material layers 312 have a thickness (dimension in the Y-axis dimension) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable value or range as can be understood based on this disclosure. In some embodiments, sacrificial layers 311 and channel material layers 312 have a thickness of at least 2, 5, 8, 10, 15, 20, 25, or 50 nm, and/or a height of at most 100, 75, 50, 40, 30, 25, 20, 15, 12, or 10 nm, for example. In some embodiments, sacrificial layers 311 and channel material layers 312 all have the same thicknesses, such as is shown in FIGS. 3A and 3B. However, in other embodiments, the thicknesses may differ. For instance, in some embodiments, the thicknesses of sacrificial layers 311 may all be the same, and the thicknesses of channel material layer 312 may all be the same, but the thicknesses of layers 311 relative to layers 312 may be different (where layers 311 would be relatively thicker or thinner than layers 312). In some embodiments, the thickness of a sacrificial layer 311 is different relative to another sacrificial layer 311 and/or the thickness of a channel material layer 312 is different relative to another channel material layer 312. Moreover, the thicknesses of the channel material layers 312 may be affected by the selective etch processing used to at least partially remove sacrificial layers 311 and release layers 312 from layers 311, as can be understood based on this disclosure.

Isolation or STI regions 305, in some embodiments, include one or more dielectrics, such as one or more oxides (e.g., silicon dioxide), nitrides (e.g., silicon nitride), high-k dielectrics, low-k dielectrics, and/or any other suitable electrically insulating material as will be apparent in light of this disclosure. In some embodiments, isolation regions 305 include silicon, oxygen, nitrogen, and/or carbon. For instance, in some embodiments, isolation regions 305 include silicon dioxide, silicon nitride, silicon oxynitride, and/or carbon-doped silicon dioxide (or other carbon-doped oxides).

Method 200 of FIG. 2 continues with forming 206 dummy gate structures, in accordance with some embodiments. For instance, FIG. 4A illustrates the view of FIG. 3A after dummy gate structures 320 have been formed, in accordance with some embodiments. FIG. 4B illustrates an example cross-sectional view along dashed line 4B shown in FIG. 4A, in accordance with some embodiments. Note that the cross-sectional view of FIG. 4A corresponds to the view taken along dashed line 4A in FIG. 4B. In some embodiments, the dummy gate structures 320 of FIGS. 4A and 4B include a dummy gate dielectric (e.g., dummy oxide material) and a dummy gate electrode (e.g., dummy poly-silicon material) to be used for replacement gate processing in a gate-last process flow, as can be understood based on this disclosure. However, in other embodiments, dummy gate structures 320 includes any suitable sacrificial material that can be layer removed such to access multilayer stack 310 as described herein. Dummy gate structures 320, in some embodiments, can be formed 204 using any suitable techniques, such as depositing the material of dummy gate structures 320 and then patterning and etching it to form the structures shown in FIGS. 4A and 4B. Optional hard mask material 322 (e.g., including dielectric material) was also formed on dummy gate structures 320 to help protect those structures during subsequent processing, in this example embodiment. However, such hard masks 322 need not be utilized, in some embodiments.

FIGS. 4A and 4B also illustrate that gate side-wall spacers 332, referred to herein as gate spacers (or simply, spacers) were also formed on either side of the dummy gate structures 320. Such gate spacers 332 can be formed using any suitable techniques, such as depositing the material of gate spacers 332 and performing spacer pattern and etch processing, for example. In some embodiments, the gate spacers 332 are used to help determine the final gate length and/or channel length (dimensions in the X-axis direction), and to help with the replacement gate processing. In some embodiments, gate spacers 332 include any dielectric material, such as an oxide (e.g., silicon dioxide), nitride (e.g., silicon nitride), high-k dielectric, low-k dielectric, and/or any other suitable electrically insulating material as can be understood based on this disclosure. In some embodiments, gate spacers 332 include silicon, oxygen, nitrogen, and/or carbon. For instance, in some embodiments, gate spacers 332 include silicon dioxide, silicon monoxide, silicon nitride, silicon oxynitride, or carbon-doped silicon dioxide (or other carbon-doped oxides). In some embodiments, it is desired to select material for gate spacers 332 that has a low dielectric constant and a high breakdown voltage. In some embodiments, gate spacers 332 include a multilayer structure (e.g., a bilayer structure where the sub-layers are laterally adjacent to each other in the X-axis direction), even though it is illustrated as a single layer in the example structure of FIG. 4A.

Figure 5B:
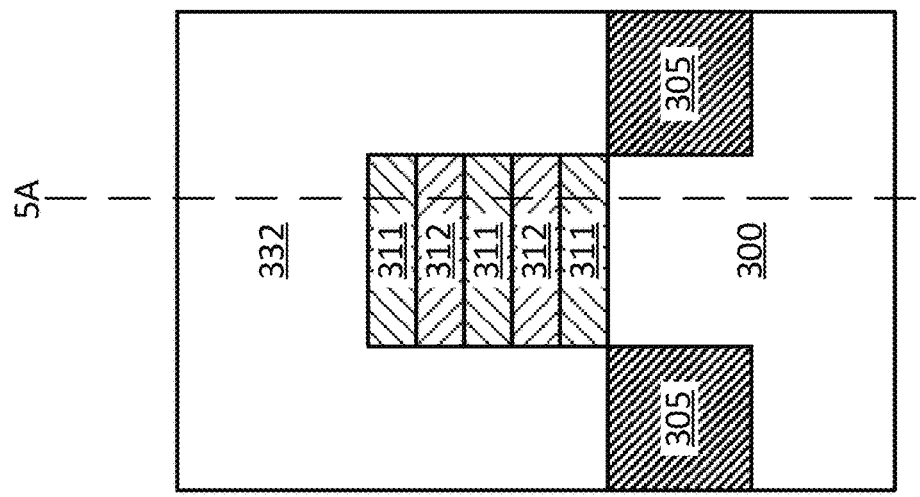
FIG. 5B illustrates an example cross-sectional view along dashed line 5B shown in FIG. 5A, in accordance with some embodiments. Note that the cross-sectional view of FIG. 5A corresponds to the view taken along dashed line 5A in FIG. 5B.
Figure 5B:
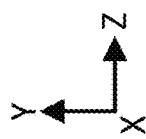
Figure 5A:
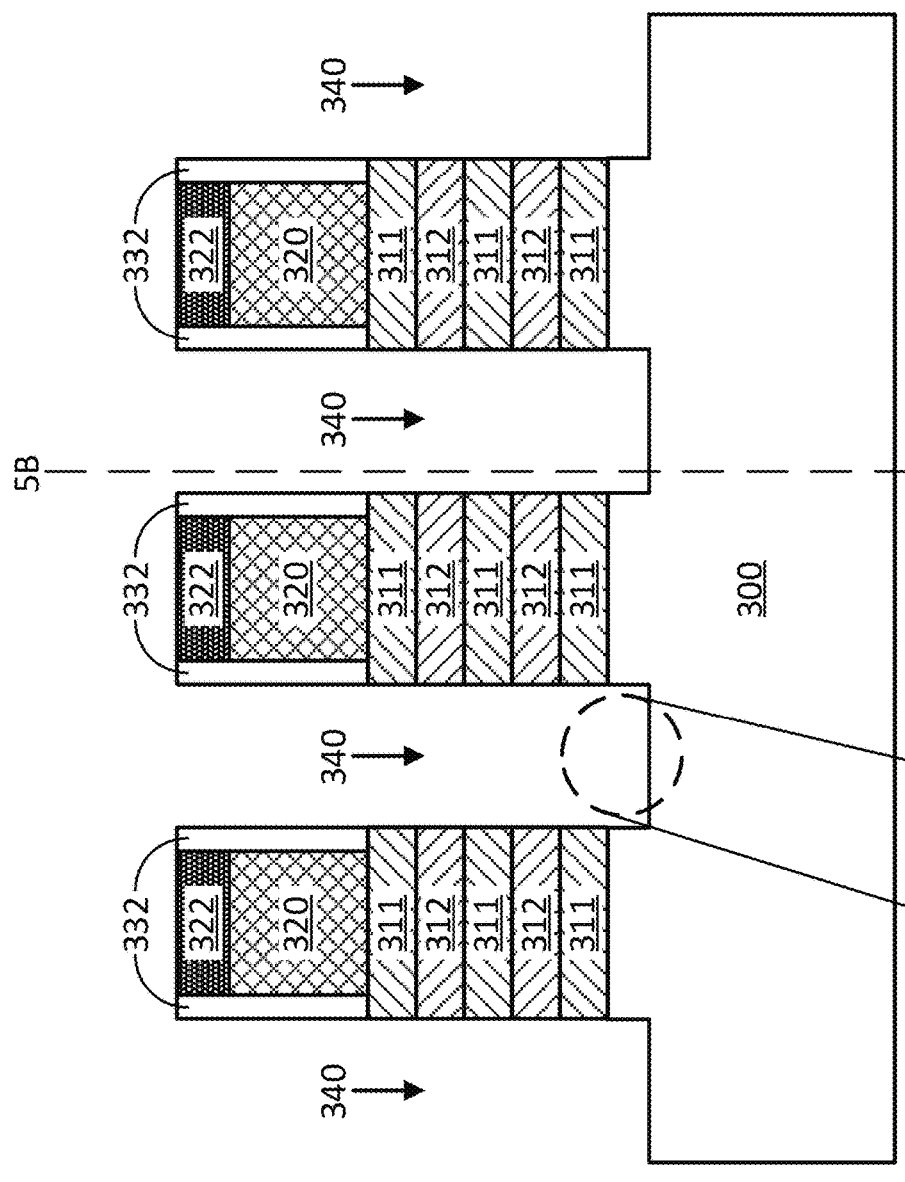
FIG. 5A illustrates the view of FIG. 4A after source/drain trenches have been formed, in accordance with some embodiments.
Figure 5A:
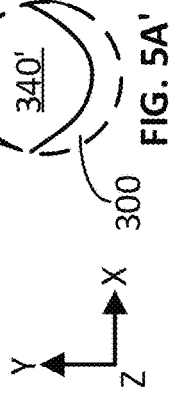

Method 200 of FIG. 2 continues with forming 208 source/drain trenches, in accordance with some embodiments. Note that the designation source/drain is used herein to refer to either a source or a drain or both, as the regions may be similar in the end structure but be differentiated based on how the device is electrically connected. For instance, this may be the case for MOSFET devices, such as NMOS and PMOS devices, where the source and drain regions of a given device includes the same material and doping scheme. However, in some embodiments, the source and drain regions may be configured differently, such as for TFET devices, where the source and drain regions of a given device are oppositely-type doped. In addition, the shape of the regions for a given device may differ, in some embodiments. Regardless, for ease of description, each of the source and drain are individually referred to herein as simply source/drain. For instance, FIG. 5A illustrates the view of FIG. 4A after source/drain trenches 340 have been formed, in accordance with some embodiments. FIG. 5B illustrates an example cross-sectional view along dashed line 5B shown in FIG. 5A, in accordance with some embodiments. Note that the cross-sectional view of FIG. 5A corresponds to the view taken along dashed line 5A in FIG. 5B. Also note that as the cross-sectional view of FIG. 5B is taken in trench 340, features behind the cross section are also shown, such as gate sidewall spacer 332 and the exposed portion of multilayer stack 310 (of layers 311/312), for example. Further note that this is the case for all such cross-sectional views that are at least partially in a trench, such as the views of FIGS. 6B, 7B, and 8B.

Figure 12B:
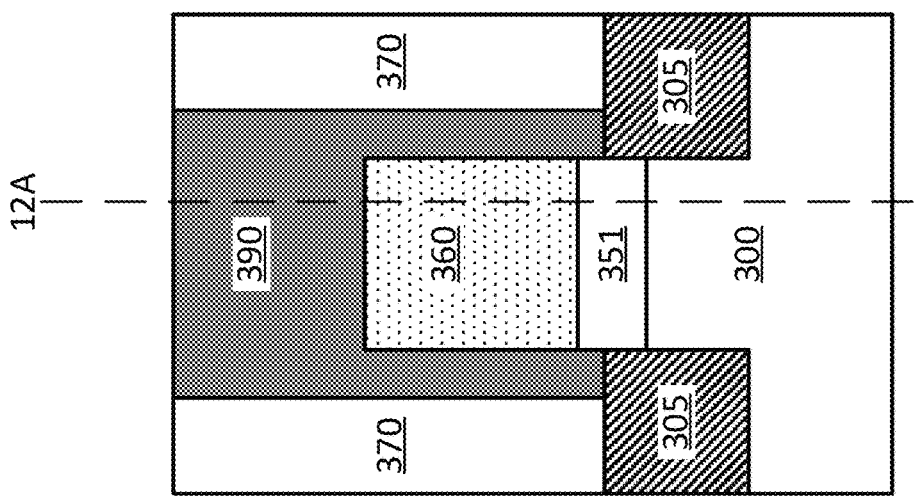
FIG. 12B illustrates an example cross-sectional view along dashed line 12B shown in FIG. 12A, in accordance with some embodiments. Note that the cross-sectional view of FIG. 12A corresponds to the view taken along dashed line 12A in FIG. 12B.
Figure 12A:
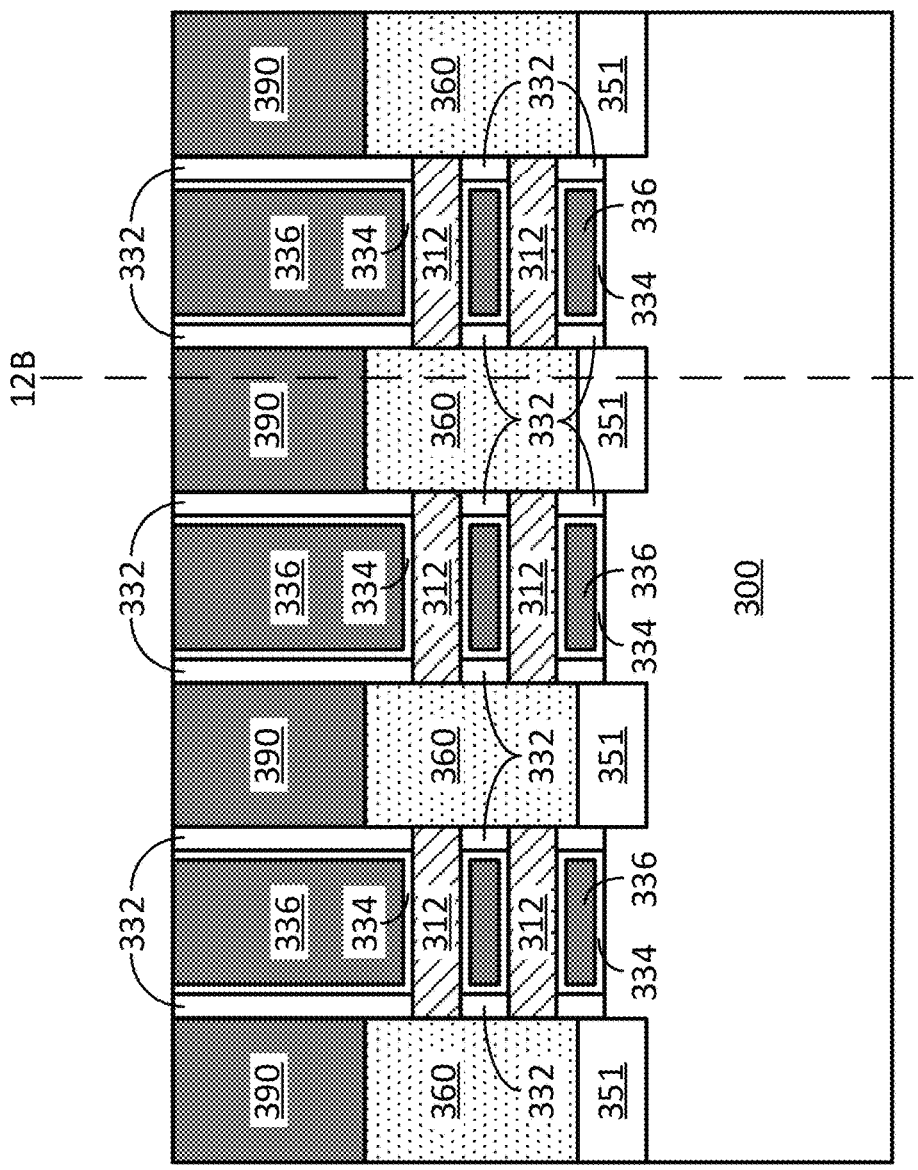
FIG. 12A illustrates the integrated circuit structure of FIG. 10A, except that gate sidewall spacer material 332 is instead at the inner spacer locations and wrapped around the bodies of channel material, in accordance with some embodiments.
Figure 13B:
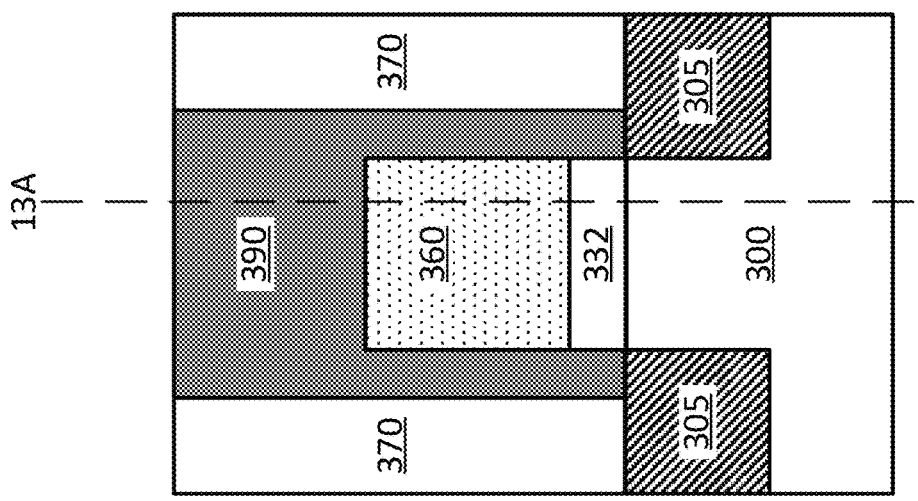
FIG. 13B illustrates an example cross-sectional view along dashed line 13B shown in FIG. 13A, in accordance with some embodiments. Note that the cross-sectional view of FIG. 13A corresponds to the view taken along dashed line 13A in FIG. 13B.
Figure 13A:
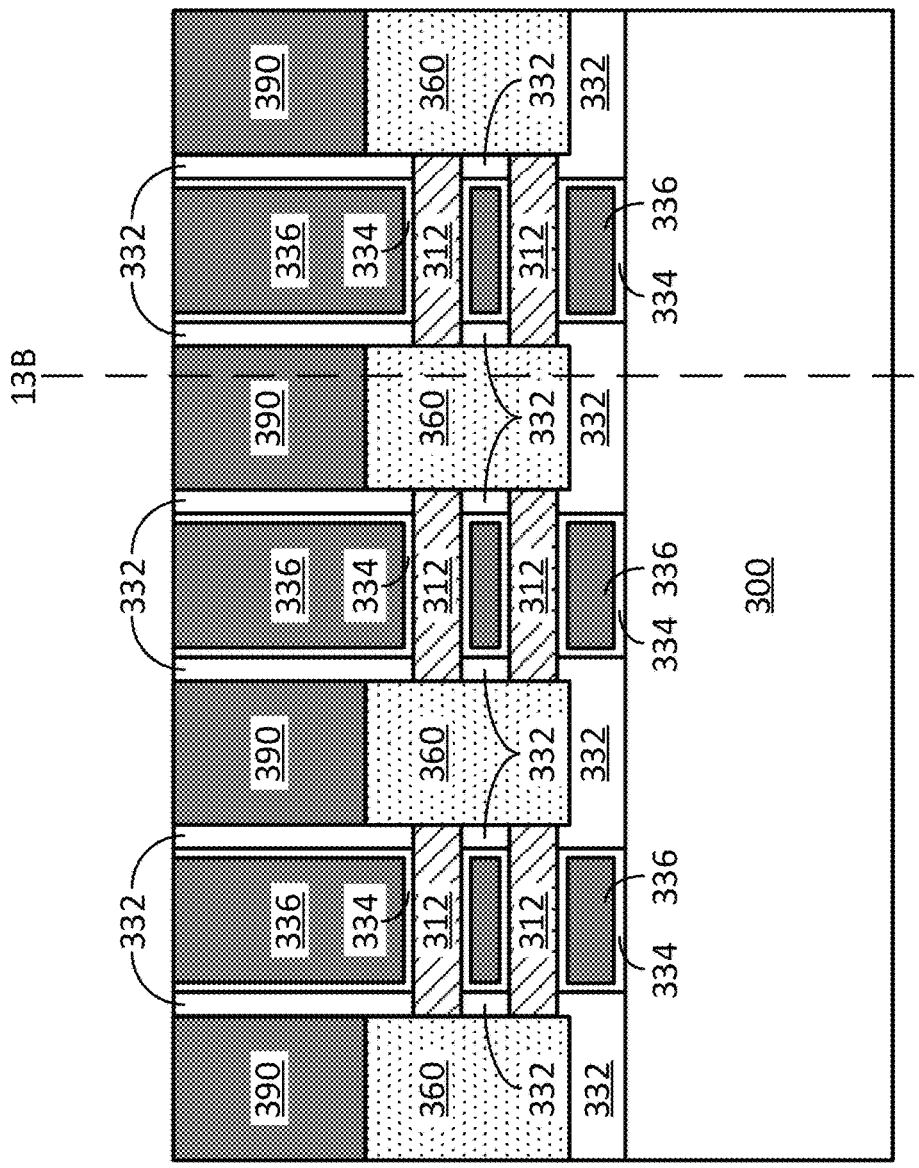
FIG. 13A illustrates the integrated circuit structure of FIG. 12A, except that gate sidewall spacer material remained at the bottom of the source/drain trenches, such that gate sidewall spacer material is between the source/drain regions and the substrate, in accordance with some embodiments.

In some embodiments, source/drain trenches can be formed using any suitable techniques, such as etching (via wet and/or dry etch processing) multilayer stack 310 in the exposed locations to form trenches 340, for example. In some embodiments, the sacrificial layers 311 are first removed from the source/drain trench locations, such as to allow the gate sidewall spacers 332 to be formed around the channel material layers 312 and not just above them (such as is shown in FIGS. 12A and 13A). In some such embodiments, the source/drain trench processing continues with etching the channel material layers 312 and performing a spacer etch as needed in the source/drain trench locations (e.g., in trenches 340). For instance, the spacer etch may leave a remainder of gate sidewall spacer material 332 in the bottom of the source/drain trench (such as is shown in FIG. 13A), or it may completely remove the gate sidewall spacer material 332 to expose the top surface of substrate 300. In addition, FIG. 5A' is a blown-out portion of FIG. 5A illustrating a source/drain trench 340' having a curved or faceted bottom, in accordance with some embodiments. Such a curved or faceted bottom portion of the source/drain trenches 340' may occur based on the processing used to form those source/drain trenches 340', for example.

Method 200 of FIG. 2 continues with recessing 210 the sacrificial layers and forming inner spacers, in accordance with some embodiments. For instance, FIG. 6A illustrates the view of FIG. 5A after inner spacers 350 have been formed, in accordance with some embodiments. FIG. 6B illustrates an example cross-sectional view along dashed line 6B shown in FIG. 6A, in accordance with some embodiments. Note that the cross-sectional view of FIG. 6A corresponds to the view taken along dashed line 6A in FIG. 6B. In some embodiments, inner spacers 350 can be formed using any suitable techniques, such as selectively etching the material of sacrificial layers 311 (selective to the material of channel material layers 312) through source/drain trenches 340 to recess those layers 311 and then depositing the material of inner spacers 350, for example. In some such embodiments, the inner spacer material 350 is deposited by ALD in the recesses formed by selectively etching sacrificial layers 311. Further, the inner spacer material 350 may be formed elsewhere, such as on gate spacers 332 and the outside of channel material layers 312, but it may be etched by an isotropic etch to remove the inner spacer material 350 that is not located inside the sacrificial layer 311 recesses, for example. However, in other embodiments, a remainder of inner spacer material 350 is intentionally kept at the bottom of the source/drain trenches 340, where that remainder serves to electrically isolate the source/drain regions 360 from the substrate, such as is shown in FIG. 11A and described in more detail herein. In still other embodiments, the inner spacer material 350 is instead a portion of the gate sidewall spacer material 332, such as is shown in FIGS. 12A and 13A, and described in more detail herein.

In some embodiments, inner spacers 350 include dielectric material, such as any suitable oxide (e.g., silicon dioxide), nitride (e.g., silicon nitride), high-k dielectric, low-k dielectric, and/or any other suitable electrically insulating material as can be understood based on this disclosure. In some embodiments, inner spacers 350 include silicon, oxygen, nitrogen, and/or carbon. For instance, in some embodiments, inner spacers 350 include silicon dioxide, silicon monoxide, silicon nitride, silicon oxynitride, or carbon-doped silicon dioxide (or other carbon-doped oxides). In some embodiments, gate spacers 332 and inner spacers 350 include the same material (and are even the same layer, in some embodiments), while in other embodiments they include different material. For instance, in an example embodiment, one of the gate spacers 332 or inner spacers 350 could include silicon and oxygen (e.g., as silicon dioxide), and the other of the gate spacers 332 or inner spacers 350 could include silicon and nitrogen (e.g., as silicon nitride). In another example embodiment, one of the gate spacers 332 or inner spacers 350 could include silicon, oxygen, and nitrogen (e.g., as silicon oxynitride), and the other of the gate spacers 332 or inner spacers 350 could include silicon and only one of oxygen or nitrogen (e.g., as silicon nitride or silicon dioxide).

Method 200 of FIG. 2 continues with optionally forming 212 at least one dielectric layer on the substrate in the source/drain trenches, such as forming dielectric layer 351 in source/drain trenches 340 and on substrate 300 as shown in FIG. 6A, in accordance with some embodiments. Process 212 is optional because it need not be performed in embodiments where, in the bottom of the source/drain trenches 340, there is a remainder/portion of either the inner spacer material 350 (e.g., as shown in FIG. 11A) or gate sidewall spacer material 332 (e.g., as shown in FIG. 13A) or, or in embodiments employing opposite-type doping (e.g., via material 301) below the source/drain regions 360 (e.g., as shown in FIG. 13A). However, in this example embodiment, dielectric layer 351 was formed (e.g., via any suitable deposition processing) such that it will be between the source/drain regions 360 and substrate 300. Note that in some embodiments, dielectric layer 351, which may or may not include a multilayer structure, may be formed by converting a top portion of substrate 300 to insulator material and/or by depositing the material of dielectric layer 351. Also note that although dielectric layer 351 is only shown as remaining on substrate 300 in the embodiment of FIG. 6B, a portion of the layer may also remain on isolation regions 305 in other embodiments.

Dielectric layer 351, in embodiments where it is employed, includes dielectric material, such as any suitable oxide (e.g., silicon dioxide), nitride (e.g., silicon nitride), high-k dielectric, low-k dielectric, and/or any other suitable electrically insulating material as can be understood based on this disclosure. In some embodiments, dielectric layer 351 includes silicon, oxygen, nitrogen, and/or carbon. For instance, in some embodiments, dielectric layer 351 includes silicon dioxide, silicon monoxide, silicon nitride, silicon oxynitride, or carbon-doped silicon dioxide (or other carbon-doped oxides). In some embodiments, dielectric layer 351 is formed by converting the top surface of substrate 300 (e.g., a silicon substrate) via oxidation and/or nitridation processing. In some embodiments, dielectric layer 351 includes the same material as gate spacers 332 and/or inner spacers 350, while in other embodiments, all three features (332, 350, and 351) include different material. In addition, FIG. 6A' is a blown-out portion of FIG. 6A illustrating that the dielectric layer 351 at the bottom of the faceted or curved trench 340' of FIG. 5A' is conformal to that trench bottom, in accordance with some embodiments. Thus, regardless of whether dielectric layer 351, inner spacer material 350, or gate spacer material 332 is at the bottom of the source/drain trench (whether it is a flat, planar, curved, or faceted bottom), such dielectric material may be conformal to the bottom of that trench, as can be understood based on this disclosure.

Method 200 of FIG. 2 continues with forming 214 source/drain material in the source/drain trenches, in accordance with some embodiments. For instance, FIG. 7A illustrates the view of FIG. 6A after source/drain material 360 has been formed in the source/drain trenches 340, in accordance with some embodiments. FIG. 7B illustrates an example cross-sectional view along dashed line 7B shown in FIG. 7A, in accordance with some embodiments. Note that the cross-sectional view of FIG. 7A corresponds to the view taken along dashed line 7A in FIG. 7B. In some embodiments, source/drain material or regions 360 can be formed using any suitable techniques, such as epitaxially growing the semiconductor material included in the regions 360 from the exposed outer portions of channel material layers 312, for example. As the process includes epitaxially growing the source/drain material 360, in some embodiments, the epitaxially grown semiconductor material of those source/drain regions 360 will not significantly grow from the exposed surface of the dielectric material at the bottom of the source/drain trenches (e.g., dielectric material 351, 350, or 332, depending on the configuration). However, in embodiments where dielectric material is not at the bottom of source/drain trenches 340 (such as for the structure of FIG. 13A), the source/drain material 360 may also grow from the top portion of substrate 300, and more specifically, from the top surface of oppositely-type doped semiconductor material 301, for example. In addition, FIG. 7A' is a blown-out portion of FIG. 7A illustrating source/drain material 360 on dielectric layer 351 and in the source/drain trench 340' of FIG. 6A', in accordance with some embodiments.

Source/drain regions 360, in some embodiments, include semiconductor material. In some such embodiments, source/drain regions 360 include group IV and/or group III-V semiconductor material. This, in some embodiments, source/drain regions 360 include one or more of silicon, germanium, tin, carbon, indium, gallium, aluminum, arsenic, nitrogen, phosphorous, arsenic, or antimony. In some embodiments, source/drain regions 360 include the same group-type of semiconductor material that channel material layers 312 include. For instance, in some such embodiments where channel material layers 312 include group IV semiconductor material (e.g., Si, SiGe, Ge), source/drain regions 360 also include group IV semiconductor material. Further, in some embodiments where channel material layers 312 include group III-V semiconductor material (e.g., GaAs, InGaAs, InP), source/drain regions 360 also include group III-V semiconductor material. However, in other embodiments, one of channel material layers 312 or source/drain regions 360 include group IV semiconductor material, and the other of channel material layers 312 or source/drain regions 360 include group III-V semiconductor material. In an example embodiment, source/drain regions 360 include semiconductor material that includes germanium (e.g., in a concentration in the range of 1-100 atomic percent), which may or may not also include silicon (e.g., such that the semiconductor material is either Ge or SiGe). In another example embodiment, source/drain regions 360 include gallium and arsenic, which may or may not also include indium (e.g., such that the semiconductor material is either GaAs or InGaAs).

In some embodiments, the source/drain regions 360 include the same semiconductor material as one another (e.g., where they are processed simultaneously), while in other embodiments, the source/drain regions 360 include compositionally distinct semiconductor material from one another (e.g., where they are processed separately using masking techniques). Further, in some embodiments, the semiconductor material included in source/drain regions 360 includes dopant, such as n-type and/or p-type dopant. For instance, in some embodiments, both source/drain regions 360 for a transistor device include n-type dopant (e.g., in an NMOS device), while in other embodiments, both source/ drain regions 360 for a transistor device include p-type dopant (e.g., in a PMOS device). In still other embodiments, one of the source/drain regions 360 for a transistor device includes n-type dopant, while the other of the source/drain regions 360 for the transistor device includes p-type dopant, such as in a configuration that employs quantum tunneling (e.g., in a TFET device).

In some embodiments, one or more of source/drain regions 360 include a multilayer structure that includes at least two compositionally distinct material layers or portions. For instance, in some such embodiments employing a multilayer source/drain region, there may be a first portion nearest channel material layers 312 and a second portion nearest source/drain contact structure 390, where the first and second portions include compositionally different materials. For example, the second portion may include a relatively higher amount of dopant than the second portion, which may help prevent diffusion of undesired dopant into the adjacent channel material layers 312 and/or help reduce contact resistance. In another example, the first portion includes a first semiconductor material and the second portion includes a second semiconductor material different form the first semiconductor material. For instance, the first portion may include Si or SiGe with a relatively low Ge concentration (e.g., 0-30 atomic percent), while the second portion may include SiGe or Ge with a relatively high Ge concentration (e.g., 30-100 atomic percent). In some embodiments, one or more of source/drain regions 360 include grading (e.g., increasing and/or decreasing) of the concentration of one or more materials within the feature. For example, the atomic percent concentration of a semiconductor compound can be graded or changed throughout at least a portion of a source/drain region 360, such as the concentration of Ge or In in the region. In another example, the concentration of dopant is graded in a source/drain region 360, such as having the concentration be relatively lower near channel material layers 312 and relatively higher near the corresponding source/drain contact structure 390. This can be achieved by tuning the amount of dopant in the reactant flow (e.g., during an in-situ doping scheme), for example. Further, such a graded configuration can help prevent diffusion of undesired dopant into the channel material layers 312 and/or help reduce contact resistance, for example.

Method 200 of FIG. 2 continues with processing 216 that includes removing the dummy gate structures, processing the channel regions, and forming the final gate structures, such as via replacement gate processing, in accordance with some embodiments. For instance, FIG. 8A illustrates the view of FIG. 7A after the dummy gate structures 320 (as well as corresponding optional hardmasks 322) were removed to form trenches 342, and the sacrificial layers 311 in trenches 342 were also removed, in accordance with some embodiments. FIG. 8B illustrates an example cross-sectional view along dashed line 8B shown in FIG. 8A, in accordance with some embodiments. Note that the cross-sectional view of FIG. 8A corresponds to the view taken along dashed line 8A in FIG. 8B. As can be understood based on this disclosure, trenches 342 expose multilayer stack 310 in the channel regions that are to be used for transistor devices, in this example embodiment.

In some embodiments, dielectric layer 370, which may be considered an interlayer dielectric (ILD) layer is formed over the source/drain regions 360 such as is shown in FIG. 8A to protect the source/drain regions 360 during subsequent processing, for example. In some such embodiments, the dielectric layer 370 includes one or more dielectrics, such as one or more oxides (e.g., silicon dioxide), nitrides (e.g., silicon nitride), high-k dielectrics, low-k dielectrics, and/or any other suitable electrically insulating material as can be understood based on this disclosure. In some embodiments, dielectric layer 370 includes silicon, oxygen, nitrogen, and/or carbon. For instance, in some embodiments, dielectric layer 370 includes silicon dioxide, silicon monoxide, silicon nitride, silicon oxynitride, or carbon-doped silicon dioxide (or other carbon-doped oxides). In some embodiments, it is desired to select material for dielectric layer 370 that has a low dielectric constant and a high breakdown voltage. In some embodiments, to decrease dielectric constant, dielectric layer 370 is formed to be intentionally porous, such as including at least one porous carbon-doped oxide (e.g., porous carbon-doped silicon dioxide). In embodiments where dielectric layer 370 is porous, it includes a plurality of pores throughout at least a portion of the layer. In some embodiments, dielectric layer 370 includes a multilayer structure.

In some embodiments, optional hard mask 322 and dummy gate structure 320 are removed using any suitable techniques, such as by etching the materials to remove them and expose the underlying portion of multilayer stack 310 in trenches 342, for example. After the portions of the multilayer stack 310 are exposed by trenches 342, sacrificial layers 311 can be (at least partially) removed via selective etch processing (e.g., using a given etchant that removes the material of layers 311 selective to the material of layers 312), thereby achieving the resulting example structures of FIGS. 8A and 8B. Note that although sacrificial layers 311 are shown as having been completely removed in this example embodiment, in other embodiments, a remnant of one or more of the sacrificial layers 311 remains. In addition, in some embodiments, the processing may change the shape of channel material layers 312 in trench 342, even though they are depicted as still having their original shape in FIGS. 8A and 8B. Recall that although there are two channel material layers 312 in the channel regions exposed by trenches 342, the present disclosure is not intended to be so limited. For instance, in some embodiments, 1, 2, 3, 4, 5, 6, 7, 8, 9, 10, or more channel material layers 312 may be present in each channel region. Also note that the channel material layers 312 in the channel regions (e.g., in trenches 342) may also be referred to herein as bodies, nanowires, nanoribbons, or nanosheets as can be understood based on this disclosure.

Forming 216 the final gate structures in trenches 344 continues with depositing the material of the final gate structures, which each include gate dielectric 334 and gate electrode 336, in accordance with some embodiments. For instance, FIG. 9A illustrates the view of FIG. 8A after a final gate structure (including gate dielectric 334 and gate electrode 336) is formed in each of the channel region trenches 342, in accordance with some embodiments. FIG. 9B illustrates an example cross-sectional view along dashed line 9B shown in FIG. 9A, in accordance with some embodiments. Note that the cross-sectional view of FIG. 9A corresponds to the view taken along dashed line 9A in FIG. 9B. Also note that although channel material bodies 312 are shown in FIG. 9B as having a shape that is a rectangle or a sheet, the present disclosure is not intended to be so limited. In some embodiments, the bodies of channel material 312, which may be nanowires, nanoribbons, or nanosheets, could employ various different shapes, such as a circle, oval, ellipse, square, rectangle, sheet, fin, or any other shape as can be understood based on this disclosure. Regardless of the shape, the final gate structure (including gate dielectric 334 and gate electrode 336) would still wrap around the channel material bodies 312 (such as is shown in FIG. 9B), thereby resulting in a GAA transistor configuration, as can be understood based on this disclosure.

Gate dielectric 334, in some embodiments, includes one or more dielectrics, such as one or more oxides (e.g., silicon dioxide), nitrides (e.g., silicon nitride), high-k dielectrics, low-k dielectrics, and/or any other suitable material as can be understood based on this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on the gate dielectric 334 to improve its quality when, for example, high-k dielectric material is employed.

In some embodiments, the gate dielectric 334 includes oxygen. In some such embodiments where the gate dielectric 334 includes oxygen, the gate dielectric 334 also includes one or more other materials, such as one or more of hafnium, silicon, lanthanum, aluminum, zirconium, tantalum, titanium, barium, strontium, yttrium, lead, scandium, zinc, lithium, or niobium. For instance, the gate dielectric 334 may include hafnium and oxygen (e.g., in the form of hafnium oxide or hafnium silicon oxide), or the gate dielectric 334 may include silicon and oxygen (e.g., in the form of silicon dioxide, hafnium silicon oxide, or zirconium silicon oxide), in accordance with some embodiments. In some embodiments, the gate dielectric 334 includes nitrogen. In some such embodiments where the gate dielectric 334 includes nitrogen, the gate dielectric 334 may also include one or more other materials, such as silicon (e.g., silicon nitride) for instance. In some embodiments, the gate dielectric 334 includes silicon and oxygen, such as in the form of one or more silicates (e.g., titanium silicate, tungsten silicate, niobium silicate, and silicates of other transition metals). In some embodiments, the gate dielectric 334 includes oxygen and nitrogen (e.g., silicon oxynitride or aluminum oxynitride).

In some embodiments, the gate dielectric 334 includes a multilayer structure, including two or more compositionally distinct layers. For example, a multilayer gate dielectric can be employed to obtain desired electrical isolation and/or to help transition from each channel material layer or body 312 to gate electrode 336, in accordance with some embodiments. In an example embodiment, a multilayer gate dielectric has a first layer nearest each body 312 that includes oxygen and one or more materials included in each body 312 (such as silicon and/or germanium), which may be in the form of an oxide (e.g., silicon dioxide or germanium oxide), and the multilayer gate dielectric also has a second layer farthest from each body 312 (and nearest the gate electrode 336) that includes at least one high-k dielectric (e.g., hafnium and oxygen, which may be in the form of hafnium oxide or hafnium silicon oxide). In some embodiments, gate dielectric 334 includes grading (e.g., increasing and/or decreasing) the content/concentration of one or more materials through at least a portion of the gate dielectric, such as the oxygen content/concentration within the gate dielectric 334.

In some embodiments, gate dielectric 334 has a thickness in the range of 1-30 nm (or in a sub-range of 1-5, 1-10, 1-15, 1-20, 1-25, 2-5, 2-10, 2-15, 2-20, 2-25, 2-30, 3-8, 3-12, 5-10, 5-15, 5-20, 5-25, 5-30, 10-20, 10-30, or 20-30 nm) or greater, for example, or within any other suitable range or having any other suitable value as can be understood based on this disclosure. In some embodiments, the thickness of gate dielectric 334 is at least 1, 2, 3, 5, 10, 15, 20, or 25 nm, and/or at most 30, 25, 20, 15, 10, 8, or 5 nm, for example. Note that the thicknesses described herein for gate dielectric 334 relate at least to the dimension between each body 312 and gate electrode 336 (e.g., at least the dimension in the Y-axis). In some embodiments, the thickness of gate dielectric 334 is selected, at least in part, based on the desired amount of isolation between each channel material body 312 and gate electrode 336. In some embodiments, gate dielectric 334 provides means for electrically insulating each channel material layer/body 312 from gate electrode 336. In some embodiments, the characteristics of gate dielectric 334 are selected based on desired electrical properties.

Gate electrode 336, in some embodiments, includes one or more metals, such as one or more of aluminum, tungsten, titanium, tantalum, copper, nickel, gold, platinum, ruthenium, or cobalt, for example. In some embodiments, gate electrode 336 includes carbon and/or nitrogen, such as in combination with one or more of the metals in the preceding sentence, for example. For instance, in some embodiments gate electrode 336 includes titanium and nitrogen (e.g., titanium nitride), or tantalum and nitrogen (e.g., tantalum nitride), such as in a liner layer that is in direct contact with the gate dielectric, for example. Thus, in some embodiments, gate electrode 336 includes one or more metals that may or may not include one or more other materials (such as carbon and/or nitrogen). In some embodiments, gate electrode 336 includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer.

In some embodiments, gate electrode 336 includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, gate electrode 336 includes additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether the gate electrode is to be used with an n-channel device or a p-channel device. In some embodiments, the gate electrode 336 provides means for changing the electrical attributes of each adjacent channel material layer/body 312 when a voltage is applied to the gate electrode 336.

In some embodiments, gate electrode 336 has a thickness (dimension in the Y-axis direction in the view of FIGS. 9A and 9B) in the range of 10-100 nm (or in a sub-range of 10-25, 10-50, 10-75, 20-30, 20-50, 20-75, 20-100, 30-50, 30-75, 30-100, 50-75, or 50-100 nm) or greater, for example, or within any other suitable range or having any other suitable value as can be understood based on this disclosure. In an embodiment, gate electrode 336 has a thickness that falls within the sub-range of 20-40 nm. In some embodiments, gate electrode has a thickness of at least 10, 15, 20, 25, 30, 40, or 50 nm and/or at most 100, 50, 40, 30, 25, or 20 nm, for example. In some embodiments, gate electrode 336 includes grading (e.g., increasing and/or decreasing) the content/concentration of one or more materials through at least a portion of the structure.

Method 200 of FIG. 2 continues with forming 218 source/drain contact structures, in accordance with some embodiments. For instance, FIG. 10A illustrates the view of FIG. 9A after source/drain contact structures 390 have been formed, in accordance with some embodiments. FIG. 10B illustrates an example cross-sectional view along dashed line 10B shown in FIG. 10A, in accordance with some embodiments. Note that the cross-sectional view of FIG. 10A corresponds to the view taken along dashed line 10A in FIG. 10B. In some embodiments, the source/drain contact structure formation 218 includes forming source/drain contact trenches in dielectric or ILD layer 370 via etch processing in which the source/drain contact structures 390 can be formed. In some such embodiments, dielectric or ILD layer 370 is completely removed between gate spacers 332 and above source/drain contact structures 390, such as is shown in FIG. 10A. However, in other embodiments, a portion of dielectric layer 370 remains between gate spacers 332, such as is shown in FIG. 14A.

Source/drain contact structures 390, in some embodiments, include one or more metals. For instance, one or both of source/drain contact structures may include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the source/drain contact trenches, where such additional layers would be a part of the source/drain contact structures 390. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given source/drain region 360 and its corresponding source/drain contact structure 390, where the contact resistance reducing layer includes semiconductor material and relatively high dopant (e.g., with dopant concentrations greater than 1E19, 1E20, 1E21, 5E21, or 1E22 atoms per cubic cm), for example.

Method 200 of FIG. 2 continues with completing 220 integrated circuit processing, as desired, in accordance with some embodiments. Such additional processing to complete the integrated circuit can include back-end or back-end-of-line (BEOL) processing to form one or more metallization layers and/or to interconnect the devices formed during the front-end or front-end-of-line (FEOL) processing, such as the transistor devices described herein. Note that the processes 202-220 of method 200 are shown in a particular order for ease of description, in accordance with some embodiments. However, in some embodiments, one or more of the processes 202-220 are performed in a different order and/or additional processes not shown are performed, as can be understood based on this disclosure. For example, optional box 212 need not be performed as variously described herein. In addition, box 210 may not be performed, or may be performed in a different manner, in embodiments where the gate sidewall spacer material 332 is formed at the inner spacer locations, for example. Numerous variations on method 200 and the techniques described herein will be apparent in light of this disclosure.

FIG. 11A illustrates the integrated circuit structure of FIG. 10A, except that inner spacer 350 material is also between the source/drain regions 360 and substrate 300, in accordance with some embodiments. FIG. 11B illustrates an example cross-sectional view along dashed line 11B shown in FIG. 11A, in accordance with some embodiments. Note that the cross-sectional view of FIG. 11A corresponds to the view taken along dashed line 11A in FIG. 11B. In the example structure of FIG. 11A, it is shown that the inner spacer material 350 is between the substrate and both of the bottommost body of channel material 312 and the source/drain material 360. This can be achieved by forming the inner spacer material 350 in the source/drain trenches 340 as previously described, but then leaving a remainder at the bottom of those trenches 340 to achieve the resulting final structure of FIG. 11A, in accordance with some embodiments. As can be understood based on this disclosure, dielectric layer 351 need not be formed for such a structure, as dielectric material 350 would already be at the locations of interest (between the source/drain material 360 and substrate 300) to help prevent sub-fin leakage.

FIG. 12A illustrates the integrated circuit structure of FIG. 10A, except that gate sidewall spacer material 332 is instead at the inner spacer locations (e.g., at the locations indicated by inner spacers 350 in FIG. 6A), in accordance with some embodiments. FIG. 12B illustrates an example cross-sectional view along dashed line 12B shown in FIG. 12A, in accordance with some embodiments. Note that the cross-sectional view of FIG. 12A corresponds to the view taken along dashed line 12A in FIG. 12B. As described herein, in some embodiments, the gate sidewall spacer material 332 may be formed after forming the dummy gate structures (e.g., structures 320) and after removing the portions of sacrificial material layers 311 between the dummy gate structures, such that the gate sidewall spacer material 332 wraps around the channel material layers 312, as shown in FIG. 12A. FIG. 12A also shows that dielectric layer 351 was still formed at the bottom of source/drain trenches 340 to help prevent sub-fin leakage.

FIG. 13A illustrates the integrated circuit structure of FIG. 12A, except that gate sidewall spacer material 332 remained at the bottom of the source/drain trenches, such that gate sidewall spacer material 332 is between the source/drain regions 360 and substrate 300, in accordance with some embodiments. FIG. 13B illustrates an example cross-sectional view along dashed line 13B shown in FIG. 13A, in accordance with some embodiments. Note that the cross-sectional view of FIG. 13A corresponds to the view taken along dashed line 13A in FIG. 13B. The structure of FIG. 13A can be achieved by targeting the spacer etch and/or the source/drain trench etch (which may be referred to as an undercut etch if the etch extends under the gate spacer or gate structure) to stop before reaching the substrate, such that a portion of gate sidewall spacer material 332 remains on substrate 300 as shown. Such embodiments may require a larger gap between the substrate and the bottommost body of channel material 312, as is also shown in FIG. 13A (note the distance in the Y-axis direction being intentionally greater between the bottommost body of channel material 312 than between the two bodies of channel material 312). As can be understood based on this disclosure, dielectric layer 351 need not be formed for such a structure, as dielectric material 332 would already be at the locations of interest (between the source/drain material 360 and substrate 300) to help prevent sub-fin leakage.

FIG. 14A illustrates the integrated circuit structure of FIG. 10A, except that substrate modification is employed for the sub-fin isolation scheme, such that there is oppositely-type doped semiconductor material 301 below the source/drain regions 360, in accordance with some embodiments. FIG. 14B illustrates an example cross-sectional view along dashed line 14B shown in FIG. 14A, in accordance with some embodiments. Note that the cross-sectional view of FIG. 14A corresponds to the view taken along dashed line 14A in FIG. 14B. Recall, as was discussed with respect to FIG. 3A, substrate modification may be performed in some embodiments to eventually create a p-n or n-p junction between source/drain regions 360 and underlying oppositely-type doped semiconductor material 301. That was performed for the structure of FIG. 14A, as shown. In addition, where optional diffusion barrier layer 302 is employed, it would remain at least below the channel regions and final gate structures, as shown in FIG. 14A. As can be understood based on this disclosure, dielectric layer 351 need not be formed for such a structure, nor would there be a need for any other dielectric material (e.g., dielectric material 332 or 350) at the locations of interest (between the source/drain material 360 and substrate 300), as oppositely-type doped semiconductor material 301 would help prevent sub-fin leakage due to the p-n or n-p junction formed. For instance, if the source/drain regions 360 are targeted to include one of n-type or p-type dopant (e.g., for NMOS or PMOS configurations, respectively), then oppositely-type doped semiconductor material 301 would include the other of n-type or p-type, in embodiments employing such a sub-fin isolation scheme. Note that although inner spacer material 350 is shown at those locations in FIG. 14A, gate sidewall spacer material 332 may alternatively be at those locations (similar to the structure of FIG. 12A). Numerous variations and configurations will be apparent in light of this disclosure.

Example System

Figure 15:
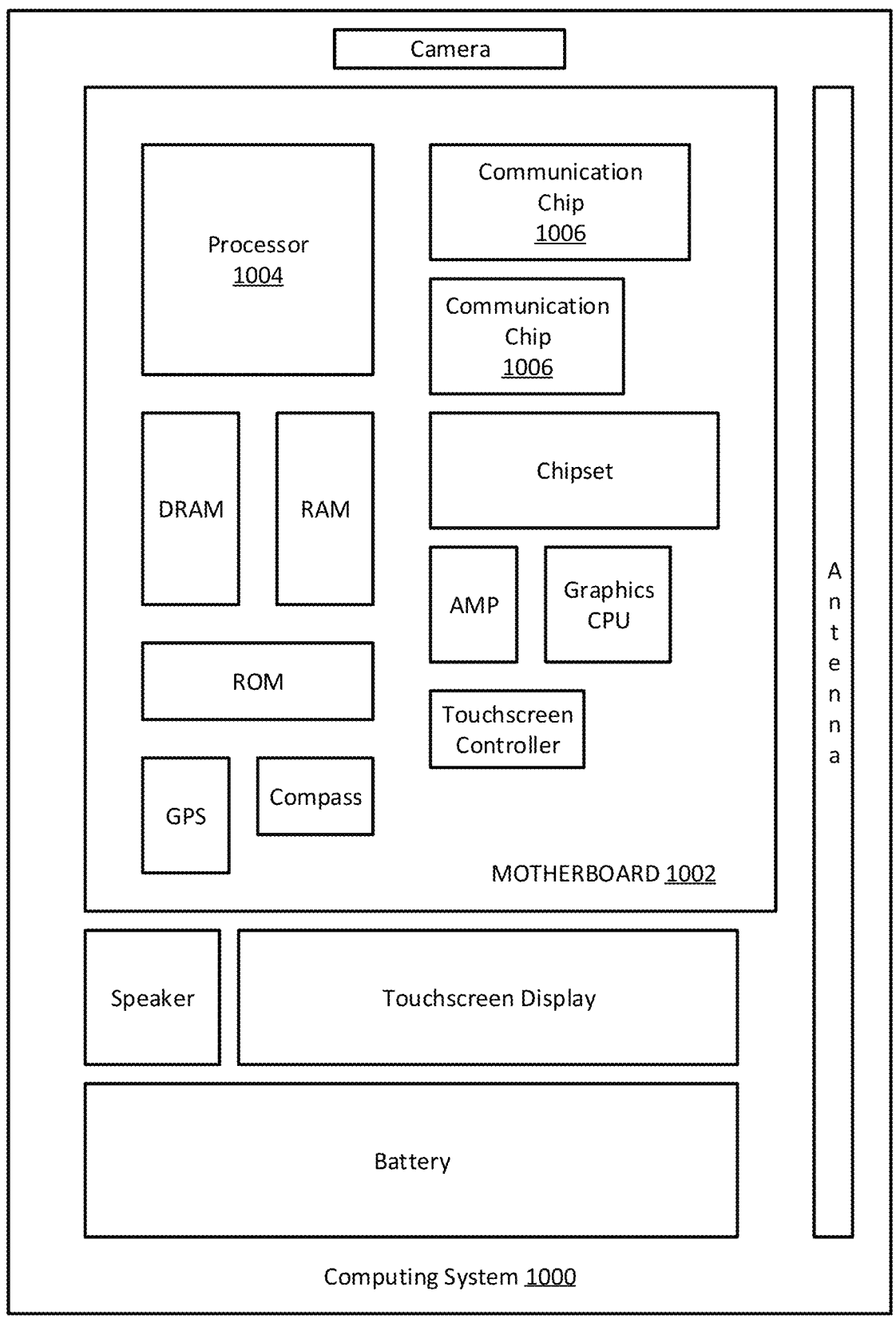
FIG. 15 illustrates a computing system implemented with integrated circuit structures including at least one gate-all-around (GAA) transistor device employing one or more sub-fin isolation schemes as variously disclosed herein, in accordance with some embodiments.

FIG. 15 illustrates a computing system 1000 implemented with integrated circuit structures including at least one gate-all-around (GAA) transistor device employing one or more sub-fin isolation schemes as variously disclosed herein, in accordance with some embodiments. For example, the integrated circuit structures disclosed herein can be included in one or more portions of computing system 1000. As can be seen, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit including at least one transistor, the integrated circuit including: a substrate; a body above the substrate, the body including semiconductor material; a gate structure wrapped around the body and in contact with the substrate, the gate structure including a gate electrode and a gate dielectric, the gate dielectric between the gate electrode and the body, the gate electrode including one or more metals; a source region and a drain region, the body between the source and drain regions, the source and drain regions including semiconductor material; a first layer including one or more dielectrics, at least a portion of the first layer between the substrate and the source region; and a second layer including one or more dielectrics, at least a portion of the second layer between the substrate and the drain region.

Example 2 includes the subject matter of Example 1, wherein the substrate is a bulk silicon substrate.

Example 3 includes the subject matter of Example 1 or 2, wherein the body is a nanowire, nanoribbon, or nanosheet.

Example 4 includes the subject matter of any of Examples 1-3, wherein the first and second layers include the same material.

Example 5 includes the subject matter of any of Examples 1-4, wherein a portion of the first layer is between the body and the substrate, and a portion of the second layer is between the body and the substrate.

Example 6 includes the subject matter of any of Examples 1-5, further including: a first contact structure in contact with the source region, the first contact structure including one or more metals, a portion of the first layer between the gate structure and the first contact structure; and a second contact structure in contact with the drain region, the second contact structure including one or more metals, a portion of the second layer between the gate structure and the second contact structure.

Example 7 includes the subject matter of any of Examples 1-6, wherein the first layer is conformal to a first trench formed in the substrate, and the second layer is conformal to a second trench formed in the substrate.

Example 8 includes the subject matter of any of Examples 1-7, wherein the semiconductor material included in the body includes at least one of silicon or germanium.

Example 9 includes the subject matter of any of Examples 1-7, wherein the semiconductor material included in the body includes group III-V semiconductor material.

Example 10 includes the subject matter of any of Examples 1-9, wherein a bottom surface of the first layer is lower than a top surface of the substrate, and a bottom surface of the second layer is lower than a top surface of the substrate.

Example 11 includes the subject matter of any of Examples 1-10, further including an additional body between the source and drain regions, the additional body above the body, the additional body including semiconductor material, wherein a distance between the substrate and the body is greater than a distance between the body and the additional body.

Example 12 includes the subject matter of Example 11, wherein the body and the additional body include the same material.

Example 13 includes the subject matter of any of Examples 1-12, further including a transistor, wherein the transistor includes the body, the gate structure, the source region, and the drain region.

Example 14 includes the subject matter of Example 13, wherein the transistor is a p-channel metal-oxide-semiconductor (PMOS) device.

Example 15 includes the subject matter of Example 13, wherein the transistor is an n-channel metal-oxide-semiconductor (NMOS) device.

Example 16 includes the subject matter of Example 13, wherein the transistor is a complementary metal-oxide-semiconductor (PMOS) device.

Example 17 includes the subject matter of any of Examples 13-16, wherein the transistor is a logic device.

Example 18 includes the subject matter of any of Examples 13-16, wherein the transistor is an input/output (I/O) device.

Example 19 includes the subject matter of any of Examples 13-16, wherein the transistor is a graphics processing unit (GPU) device.

Example 20 is a computing system including the subject matter of any of Examples 1-19.

Example 21 is an integrated circuit including at least one transistor, the integrated circuit including: a substrate; a body above the substrate, the body including semiconductor material; a gate structure wrapped around the body, the gate structure including a gate electrode and a gate dielectric, the gate dielectric between the gate electrode and the body, the gate electrode including one or more metals; and a source region and a drain region, the body between the source and drain regions, the source and drain regions including semiconductor material and one of n-type or p-type dopant, the source and drain regions on semiconductor material including the other of n-type or p-type dopant.

Example 22 includes the subject matter of Example 21, wherein a portion of the source region is between portions of the semiconductor material including the other of n-type or p-type dopant, and a portion of the drain region is between portions of the semiconductor material including the other of n-type or p-type dopant.

Example 23 includes the subject matter of Example 21 or 22, wherein the substrate is a bulk silicon substrate.

Example 24 includes the subject matter of any of Examples 21-23, wherein the body is a nanowire, nanoribbon, or nanosheet.

Example 25 includes the subject matter of any of Examples 21-24, wherein the semiconductor material including the other of n-type or p-type dopant is native to the substrate.

Example 26 includes the subject matter of any of Examples 21-24, wherein the semiconductor material including the other of n-type or p-type dopant is distinct from the substrate, such that a bottom surface of the semiconductor material including the other of n-type or p-type dopant is in contact with a top surface of the substrate.

Example 27 includes the subject matter of any of Examples 21-26, further including a layer including carbon between the gate structure and the substrate.

Example 28 includes the subject matter of Example 27, wherein the layer is in contact with the semiconductor material including the other of n-type or p-type dopant.

Example 29 includes the subject matter of Example 27 or 28, wherein the layer is absent between the source region and the substrate, and the layer is absent between the drain region and the substrate.

Example 30 includes the subject matter of any of Examples 21-29, further including a transistor, wherein the transistor includes the body, the gate structure, the source region, and the drain region.

Example 31 includes the subject matter of Example 30, wherein the transistor is a p-channel metal-oxide-semiconductor (PMOS) device.

Example 32 includes the subject matter of Example 30, wherein the transistor is an n-channel metal-oxide-semiconductor (NMOS) device.

Example 33 includes the subject matter of Example 30, wherein the transistor is a complementary metal-oxide-semiconductor (PMOS) device.

Example 34 includes the subject matter of any of Examples 30-33, wherein the transistor is a logic device.

Example 35 includes the subject matter of any of Examples 30-33, wherein the transistor is an input/output (I/O) device.

Example 36 includes the subject matter of any of Examples 30-33, wherein the transistor is a graphics processing unit (GPU) device.

Example 37 is a computing system including the subject matter of any of Examples 30-36.

Example 38 is a method of forming the subject matter of any of Examples 1-20. For example, relative to Example 1, the method would be forming an integrated circuit including at least one transistor, the method including: providing a substrate; forming a body above the substrate, the body including semiconductor material; forming a gate structure wrapped around the body, the gate structure including a gate electrode and a gate dielectric, the gate dielectric between the gate electrode and the body, the gate electrode including one or more metals, the gate structure in contact with the substrate; forming a source region and a drain region, the body between the source and drain regions, the source and drain regions including semiconductor material; forming a first layer including one or more dielectrics, at least a portion of the first layer between the substrate and the source region; and forming a second layer including one or more dielectrics, at least a portion of the second layer between the substrate and the drain region.

Example 39 is a method of forming the subject matter of any of Examples 21-37. For example, relative to Example 21, the method would be forming an integrated circuit including at least one transistor, the integrated circuit including: providing a substrate; forming a body above the substrate, the body including semiconductor material; forming a gate structure wrapped around the body, the gate structure including a gate electrode and a gate dielectric, the gate dielectric between the gate electrode and the body, the gate electrode including one or more metals; and forming a source region and a drain region, the body between the source and drain regions, the source and drain regions including semiconductor material and one of n-type or p-type dopant, the source and drain regions on semiconductor material including the other of n-type or p-type dopant.

Example 40 includes the subject matter of Example 39, wherein the semiconductor material including the other of n-type or p-type dopant is formed prior to forming the body.

Example 41 includes the subject matter of Example 40, wherein the semiconductor material including the other of n-type or p-type dopant is formed by adding the other of n-type or p-type dopant to a top portion of the substrate.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a substrate;
    a body above the substrate, the body including semiconductor material;
    a gate structure wrapped around the body and in contact with the substrate, the gate structure including a gate electrode and a gate dielectric, the gate dielectric between the gate electrode and the body, the gate electrode including one or more metals, and the gate structure having a bottommost surface;
    a source region and a drain region, the body between the source and drain regions, the source and drain regions including semiconductor material;
    a first layer including one or more dielectrics, at least a portion of the first layer between the substrate and the source region, wherein the first layer does not extend vertically beneath the gate structure, and wherein the first layer has an uppermost surface above the bottommost surface of the gate structure; and
    a second layer including one or more dielectrics, at least a portion of the second layer between the substrate and the drain region, wherein the second layer does not extend vertically beneath the gate structure, wherein the second layer has an uppermost surface above the bottommost surface of the gate structure, and wherein the second layer has a bottommost surface at a same level as the bottommost surface of the gate structure.

2. The integrated circuit of claim 1, wherein the substrate is a bulk silicon substrate.

3. The integrated circuit of claim 1, wherein the body is a nanowire, nanoribbon, or nanosheet.

4. The integrated circuit of claim 1, wherein the first and second layers include the same material.

5. The integrated circuit of claim 1, wherein a portion of the first layer is between the body and the substrate, and a portion of the second layer is between the body and the substrate.

6. The integrated circuit of claim 1, further comprising:
a first contact structure in contact with the source region, the first contact structure including one or more metals, a portion of the first layer between the gate structure and the first contact structure; and
a second contact structure in contact with the drain region, the second contact structure including one or more metals, a portion of the second layer between the gate structure and the second contact structure.

7. The integrated circuit of claim 1, wherein the first layer is conformal to a first trench formed in the substrate, and the second layer is conformal to a second trench formed in the substrate.

8. The integrated circuit of claim 1, wherein the semiconductor material included in the body includes at least one of silicon or germanium.

9. The integrated circuit of claim 1, wherein the semiconductor material included in the body includes group III-V semiconductor material.

10. The integrated circuit of claim 1, wherein a bottom surface of the first layer is lower than a top surface of the substrate, and a bottom surface of the second layer is lower than a top surface of the substrate.

11. The integrated circuit of claim 1, further comprising an additional body between the source and drain regions, the additional body above the body, the additional body including semiconductor material, wherein a distance between the substrate and the body is greater than a distance between the body and the additional body.

12. The integrated circuit of claim 11, wherein the body and the additional body include the same material.

13. A computing system comprising the integrated circuit of claim 1.

14. An integrated circuit including at least one transistor, the integrated circuit comprising:
a substrate;
a body above the substrate;
a gate structure wrapped around the body, the gate structure including a gate electrode and a gate dielectric, the gate dielectric between the gate electrode and the body, the gate electrode including one or more metals, and the gate structure having a bottommost surface;
a source region and a drain region, the body between the source and drain regions, the source and drain regions including semiconductor material and one of n-type or p-type dopant, the source and drain regions on semiconductor material including the other of n-type or p-type dopant, a portion of the source region between portions of the semiconductor material including the other of n-type or p-type dopant, and a portion of the drain region between portions of the semiconductor material including the other of n-type or p-type dopant, wherein the source and drain regions have a bottommost surface above the bottommost surface of the gate structure; and
a layer including one or more dielectrics, a first portion of the layer between the substrate and the source region, and a second portion of the layer between the substrate and the drain region, wherein the layer has an uppermost surface above the bottommost surface of the gate structure, and wherein the layer has a bottommost surface at a same level as the bottommost surface of the gate structure.

15. The integrated circuit of claim 14, wherein the substrate is a bulk silicon substrate.

16. The integrated circuit of claim 14, wherein the body is a nanowire, nanoribbon, or nanosheet.

17. The integrated circuit of claim 14, wherein the semiconductor material including the other of n-type or p-type dopant is native to the substrate.

18. The integrated circuit of claim 14, further comprising a layer including carbon between the gate structure and the substrate.

19. A method of forming an integrated circuit including at least one transistor, the method comprising:
providing a substrate;
forming a body above the substrate, the body including semiconductor material;
forming a gate structure wrapped around the body, the gate structure including a gate electrode and a gate dielectric, the gate dielectric between the gate electrode and the body, the gate electrode including one or more metals, the gate structure in contact with the substrate, and the gate structure having a bottommost surface;
forming a source region and a drain region, the body between the source and drain regions, the source and drain regions including semiconductor material;
forming a first layer including one or more dielectrics, at least a portion of the first layer between the substrate and the source region, wherein the first layer does not extend vertically beneath the gate structure, and wherein the first layer has an uppermost surface above the bottommost surface of the gate structure; and
forming a second layer including one or more dielectrics, at least a portion of the second layer between the substrate and the drain region, wherein the second layer does not extend vertically beneath the gate structure, wherein the second layer has an uppermost surface above the bottommost surface of the gate structure, and wherein the second layer has a bottommost surface at a same level as the bottommost surface of the gate structure.

20. The method of claim 19, wherein the substrate is a bulk silicon substrate.

* * * * *